US010214817B2

(12) United States Patent
Takoudis et al.

(10) Patent No.: US 10,214,817 B2
(45) Date of Patent: Feb. 26, 2019

(54) MULTI-METAL FILMS, ALTERNATING FILM MULTILAYERS, FORMATION METHODS AND DEPOSITION SYSTEM

(71) Applicant: The Board of Trustees of the University of Illinois, Urbana (IL)

(72) Inventors: Christos G. Takoudis, Chicago, IL (US); Manish Singh, Chicago, IL (US); Sathees Kannan Selvaraj, Chicago, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 14/515,135

(22) Filed: Oct. 15, 2014

(65) Prior Publication Data
US 2015/0104575 A1    Apr. 16, 2015

Related U.S. Application Data

(60) Provisional application No. 61/891,509, filed on Oct. 16, 2013.

(51) Int. Cl.
*C23C 16/52* (2006.01)
*C23C 16/455* (2006.01)
*C23C 16/40* (2006.01)

(52) U.S. Cl.
CPC ............ *C23C 16/52* (2013.01); *C23C 16/406* (2013.01); *C23C 16/45523* (2013.01); *C23C 16/45544* (2013.01); *C23C 16/45553* (2013.01); *C23C 16/45561* (2013.01)

(58) Field of Classification Search
None
See application file for complete search history.

(56) References Cited

U.S. PATENT DOCUMENTS

| 5,435,682 | A | 7/1995 | Crabb et al. | |
| 6,338,759 | B1 * | 1/2002 | Yu | C23C 16/4481 118/50 |
| 7,037,574 | B2 | 5/2006 | Paranjape et al. | |
| 8,524,322 | B2 | 9/2013 | Blomberg | |
| 2001/0006705 | A1 * | 7/2001 | Takeshima | C23C 16/45561 118/715 |
| 2002/0000195 | A1 * | 1/2002 | Bang | C23C 16/45561 118/715 |
| 2003/0143747 | A1 * | 7/2003 | Bondestam | C23C 16/4402 436/34 |

(Continued)

OTHER PUBLICATIONS

Mantovan, R., et al., "Synthesis of magnetic tunnel junctions with full in situ atomic layer and chemical vapor deposition processes", Thin Solid Films, vol. 520, Issue 14, May 1, 2012, pp. 4507-4826.
(Continued)

*Primary Examiner* — Binu Thomas
(74) *Attorney, Agent, or Firm* — Greer, Burns & Crain, Ltd; Steven P. Fallon

(57) ABSTRACT

A deposition system can conduct ALD or CVD deposition and can switch between the deposition modes. The system is capable of depositing multi-metal films and multi-layer films of alternating ALD and CVD films. Reactant supplies can be bypassed with carrier gas flow to maintain pressure in a reactor and in reactor supply lines and purge reactants.

16 Claims, 19 Drawing Sheets

(56) References Cited

U.S. PATENT DOCUMENTS

| | | | |
|---|---|---|---|
| 2005/0087135 A1* | 4/2005 | Hioki | C23C 16/4402 118/715 |
| 2005/0106447 A1 | 5/2005 | Ralph et al. | |
| 2007/0235085 A1* | 10/2007 | Nakashima | C23C 16/4408 137/240 |
| 2008/0066680 A1 | 3/2008 | Sherman | |
| 2008/0085226 A1* | 4/2008 | Fondurulia | C23C 16/4481 422/198 |
| 2008/0317972 A1 | 12/2008 | Hendriks et al. | |
| 2009/0061648 A1* | 3/2009 | Horii | C23C 16/409 118/694 |
| 2010/0006167 A1* | 1/2010 | Nakashima | C23C 16/4408 137/861 |
| 2012/0164329 A1* | 6/2012 | Blomberg | C23C 16/45544 427/255.39 |

OTHER PUBLICATIONS

Suzuki, Y., et al., "Magnetic properties of epitaxial ferrite multilayer films", J. Appl. Phys., 79, (8), Apr. 15, 1996, pp. 5923-5925.
Wang, J., et al., "Epitaxial $BiFeO_3$ Multiferroic Thin Film Heterostructures", Science, vol. 299, Mar. 14, 2003, pp. 1719-1722.

* cited by examiner

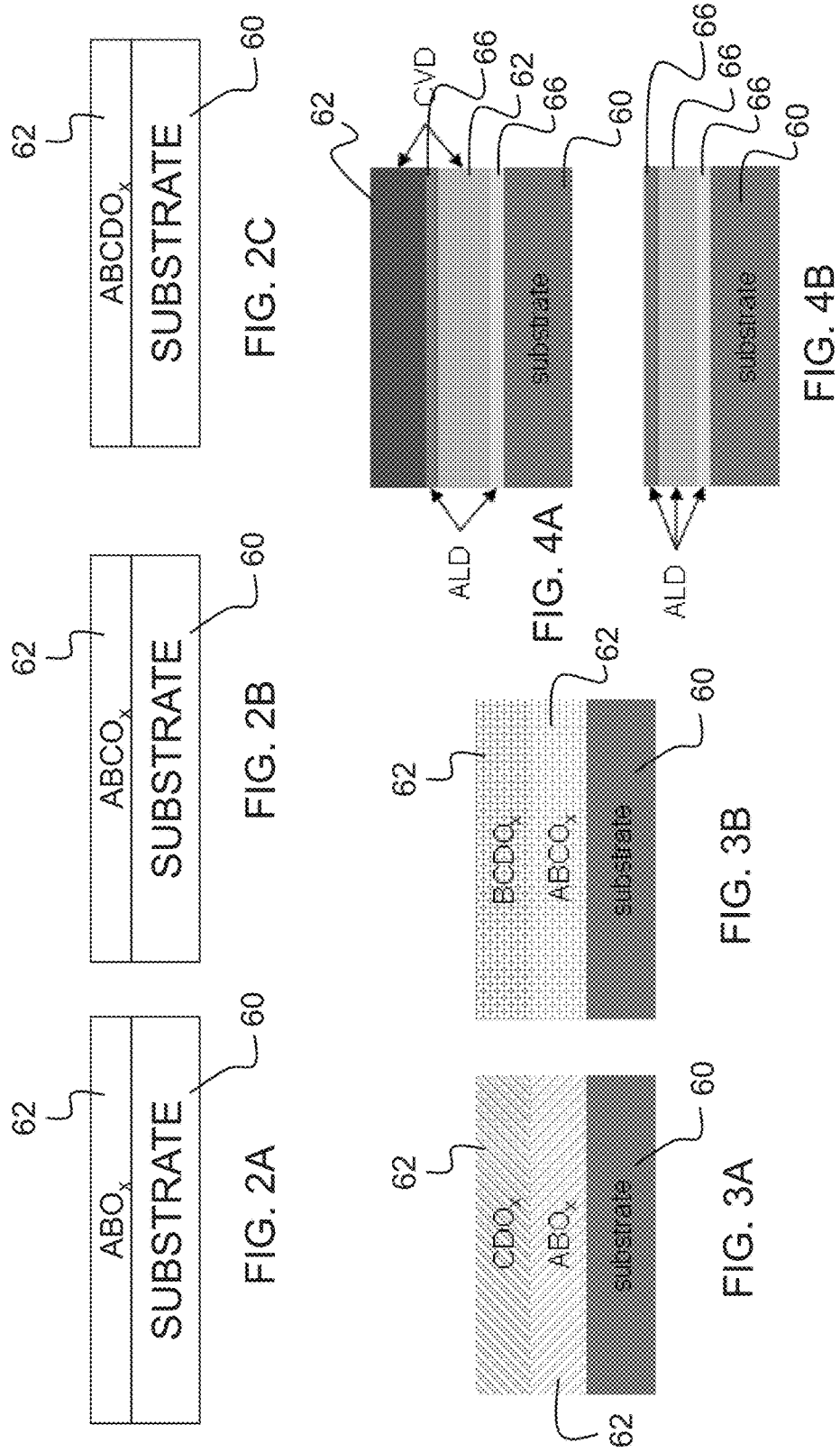

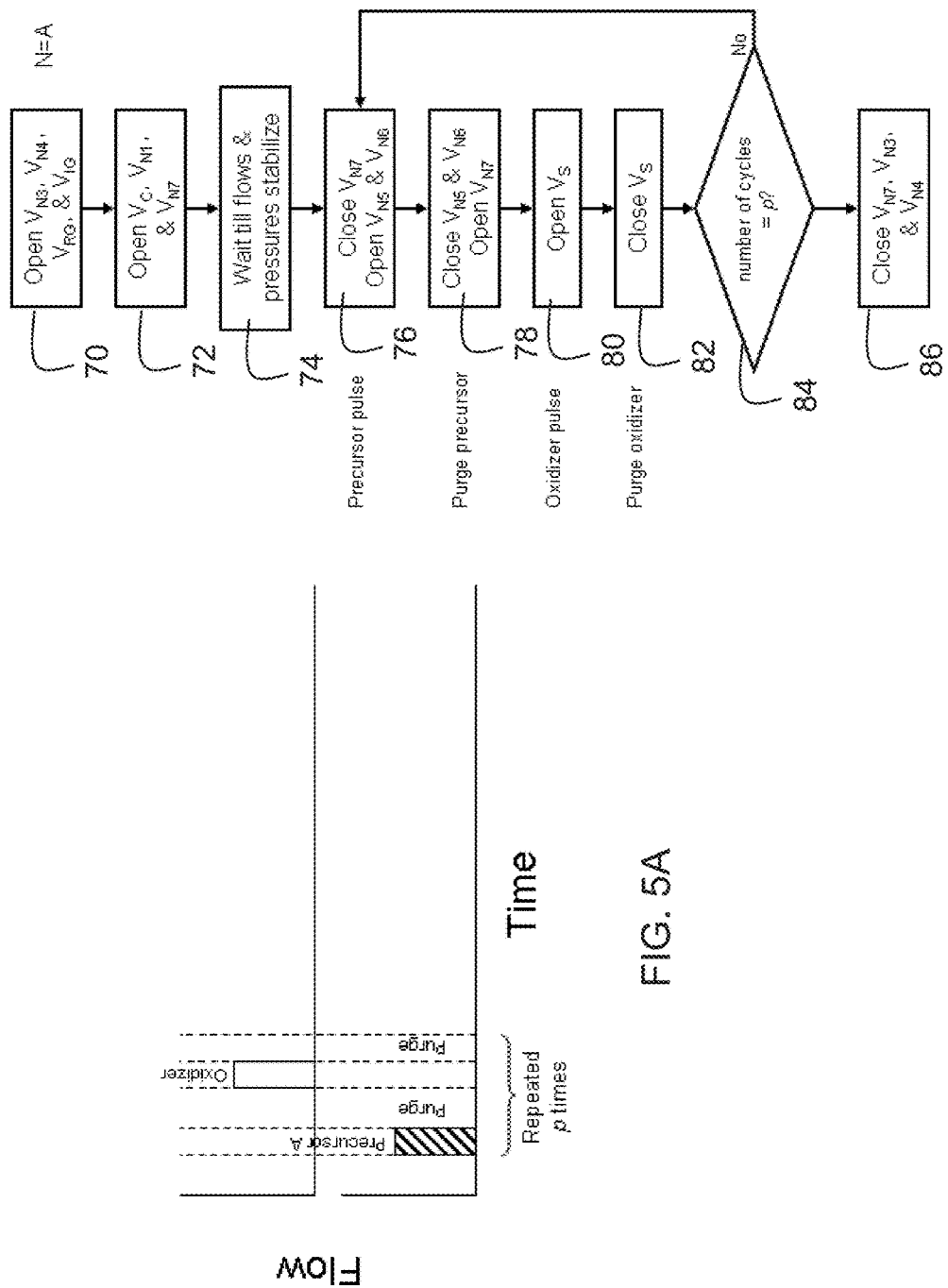

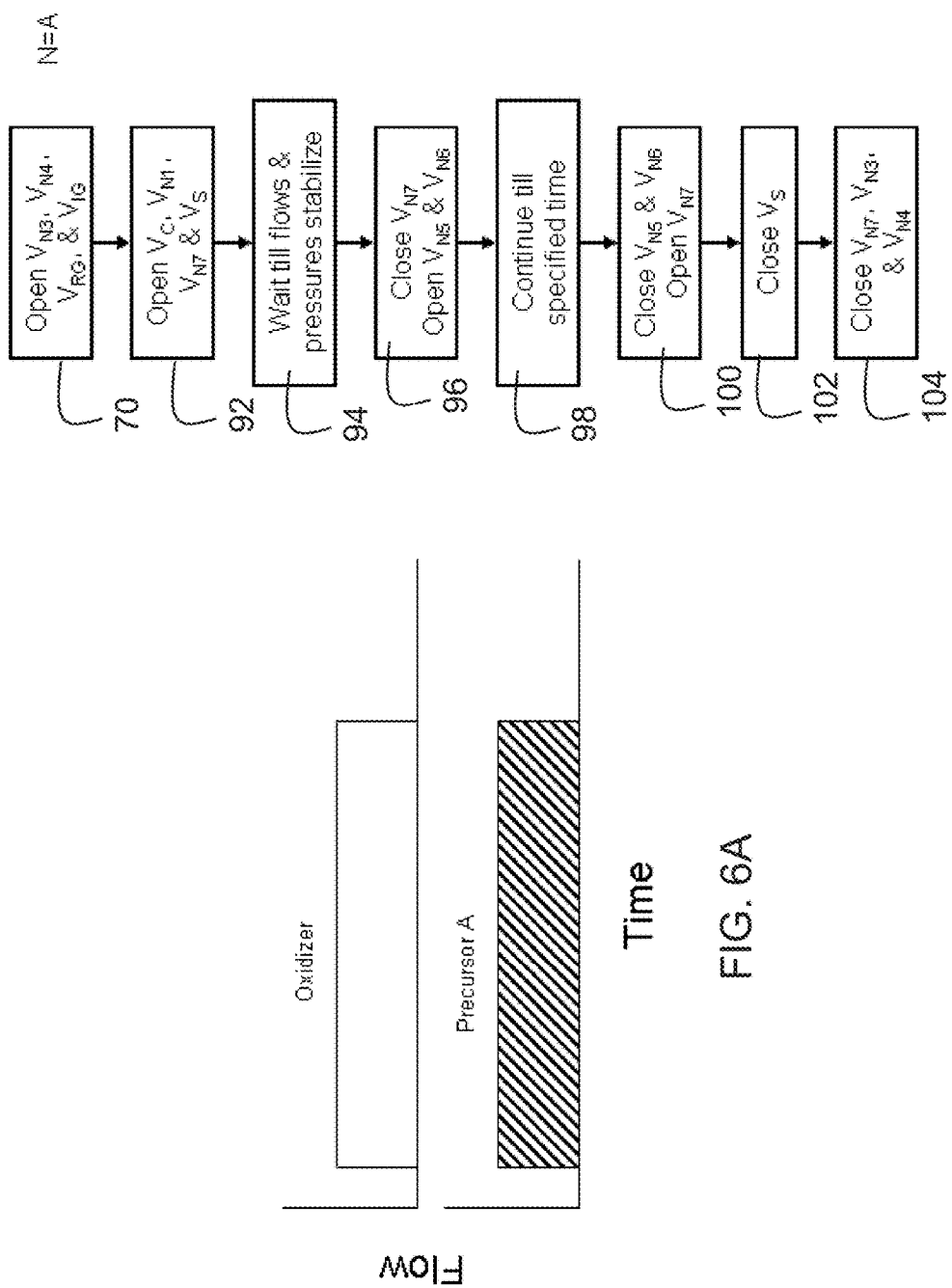

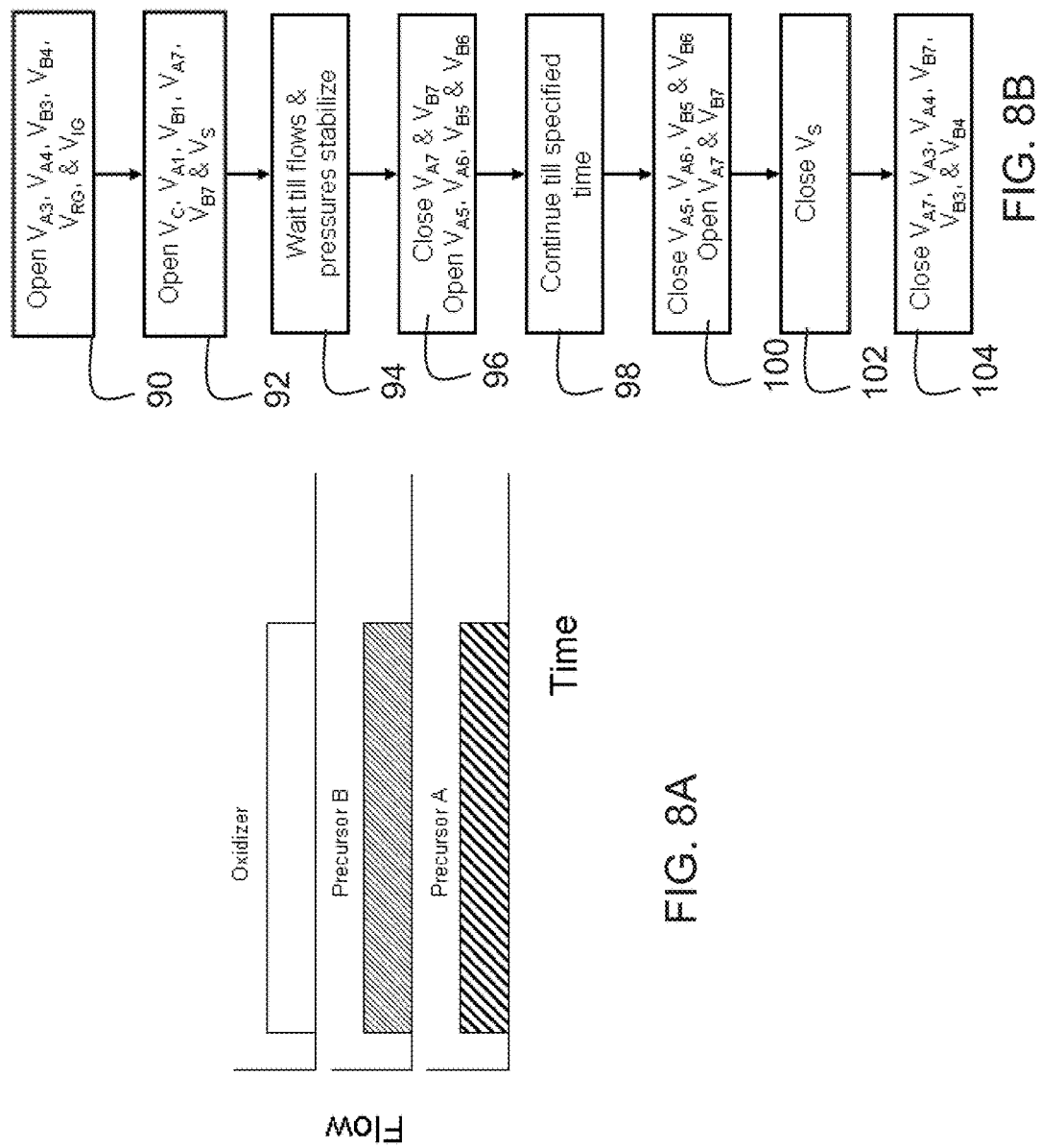

MULTI-METAL FILMS, ALTERNATING FILM MULTILAYERS, FORMATION METHODS AND DEPOSITION SYSTEM

PRIORITY CLAIM AND REFERENCE TO RELATED APPLICATION

The application claims priority under 35 U.S.C. § 119 from prior provisional application Ser. No. 61/891,509, which was filed Oct. 16, 2013, and which is incorporated by reference herein.

STATEMENT OF GOVERNMENT INTEREST

This invention was made with government support under Contract Nos. CMS 0609377 and CBET 1067424 awarded by the National Science Foundation. The government has certain rights in the invention.

FIELD

Example fields of the invention include semiconductor devices, energy devices and fabrication methods. Additional example fields of the invention include metal oxide films, and particularly complex multi-metal oxide and multi-layer films. Deposition systems of the invention have application to prepare single component and multi components films, such as dielectric/insulator films, ferroelectric films, ferrite films, magnetoelectric films, metal oxide films, metal nitride films, and various alloys.

BACKGROUND

A chemical vapor deposition (CVD) process is a deposition process where reactants are flowing together into a reactor chamber. CVD relies upon gas flows that are fully developed and tightly controlled to avoid fluctuations in pressures or gas flow rates/profiles. A number of CVD techniques have been developed, e.g., atmospheric pressure CVD, low pressure CVD and ultra-high vacuum CVD. Variations of the different pressure regime CVD processes include variations relating to methods of heating the chamber or substrate being processed. Many particular regimes of CVD are known to artisans. In general, CVD provides fast growth rates for thick layers and produces high quality layer when pressures, precursor ratios and temperatures are precisely maintained.

Atomic layer deposition (ALD) is a usually a slower process than CVD and is useful for forming thin films of a few nanometers. ALD depends upon sequential or pulsed introduction of precursors that react on a substrate. Between each precursor pulse in ALD, the reaction chamber is purged to remove precursors that did not chemisorb/react and reaction by-products. Each reaction cycle adds a given amount of material to the surface, referred to as the growth per cycle. The process is very slow because only a fraction of a monolayer is typically deposited during each reaction cycle.

Generally, conventional deposition systems and methods form either CVD or ALD layers. Devices formed from a combination of the two processes require two systems and a break of vacuum. As is known, the surface chemistry of layers can therefore be negatively affected.

Published U.S. patent application 20080317972 describes an ALD system that can operate in a "pulsed CVD mode". Such a pulsed mode produces pressure variations and layers that are realized by adjusting pulse lengths of the precursors or the purge gas. This pulsed operation obtains Si-rich HfSiO films that are difficult to obtain by conventional ALD. The pulsed CVD operation is likely to be a much slower process than continuous or true CVD and would likely produce lower quality films. The process is suitable for HfSiO and HfSiON films for which the desired thicknesses are typically of the order of a few nanometers. However, growth of thick multi-component and multilayered structures would be highly impractical by this "pulsed CVD" method.

Complex thin multi-metal oxide films have a number of promising applications. Thin epitaxial ferrite films of $CoFe_2O_4$, $NiFe_2O_4$ and $(Mn,Zn)Fe_2O_4$ deposited using pulsed laser deposition and sputtering have been studied because of their potential use in exchange-coupled biasing based devices. More recently, $BiFeO_3$ has generated interest due to its room temperature multiferroic properties. Heterostructures of ferrite and piezoelectric materials have great potential in magnetoelectric devices. Complex metal oxide film structures are also important in applications such as thermoelectric devices and solid oxide fuel cells. In order to deposit such complex oxide structures for fabrication of devices at a commercially viable scale, metalorganic chemical vapor deposition (MOCVD) is one of the most suitable techniques.

Iron-based perovskite materials have been developed as promising materials for solid oxide fuel cell cathodes and photocatalysis. See, e.g., Ralph et al., US Published App. US2005106447. Thin epitaxial ferrite films of $CoFe_2O_4$, $NiFe_2O_4$ and $(Mn,Zn)Fe_2O_4$ deposited using pulsed laser deposition and sputtering have been recently studied because of their potential use in exchange-coupled biasing based devices. Y. Suzuki, R. B. van Dover, E. M. Gyorgy, J. M. Phillips, V. Korenivski, D. J. Werder, C. H. Chen, R. J. Felder, R. J. Cava, J. J. Krajewski and J. W. F. Peck, *J. Appl. Phys.*, 79, 5923 (1996). More recently, iron-based perovskite $BiFeO_3$ has generated a lot of interest due to its room temperature multiferroic properties that could lead to the development of novel devices. J. Wang, J. B. Neaton, H. Zheng, V. Nagarajan, S. B. Ogale, B. Liu, D. Viehland, V. Vaithyanathan, D. G. Schlom, U. V. Waghmare, N. A. Spaldin, K. M. Rabe, M. Wuttig and R. Ramesh, *Science*, 299, 1719 (2003). For deposition of such complex oxide structures for fabrication of devices at a commercially viable scale, metalorganic chemical vapor deposition (MOCVD) is one of the most suitable techniques. However, applicability of this deposition technique is largely dependent on the availability of suitable liquid precursors.

MOCVD can deposit conformal thin films over large areas with the right stoichiometry, high yield and high throughput at low cost. Precursors should have a stable and reproducible high enough vapor pressure, should not decompose during transport to the reactor and should not be hazardous. Gas or liquid precursors with suitably high vapor pressures are ideal for MOCVD because of the ease with which they can be delivered to the deposition chamber in a controlled manner. For gases, a mass flow controller is conventionally used to control the dose of precursor from the precursor cylinder. In case of liquids, the use of bubblers is the most dominant delivery method. A carrier gas at a controlled flow rate is fed through the liquid in the bubbler so as to entrain the precursor molecules, thereby delivering the precursor to the reactor. The bubbler is maintained at a specific temperature using a temperature controller in order to achieve a constant equilibrium precursor vapor pressure. Thus, in both cases, a simple and inexpensive arrangement is needed to reproducibly control the vapor phase concentration of the precursor in the reactor. On the other hand, solid precursors pose several problems that may limit their suitability for MOCVD. Solid precursors have relatively low vapor pressures compared to liquids. More importantly, their vapor pressures decrease because of changing surface area as they are consumed. Also, lower vapor pressures require that solid precursors be used at elevated temperature to increase the vapor pressure; but this could lead to agglomeration and/or degradation of the precursor in the precursor vessel. In order to overcome these difficulties with solid precursors, complex and expensive non-conventional delivery approaches, like using a separate heating zone within the reaction chamber, solvent-based direct liquid injection and sublimation in a fluidized bed, have been employed. While such solid precursor delivery techniques provide possible solutions, they also bring in additional parameters that increase the complexity of the MOCVD process compared to the use of liquid precursor delivery schemes.

Iron precursors belonging to mainly four classes have been reported for the chemical vapor deposition of different iron-containing oxide films: (i) carbonyls, (ii) β-diketonates, (iii) metallocenes and (iv) alkoxides. Iron pentacarbonyl ($Fe(CO)_5$) is a liquid precursor that has been used with different carrier gases to deposit iron and iron oxide films, but its vapor pressure is too high (~28 Torr at 25° C.) to easily control its delivery to the reaction chamber in the deposition of thin films for electronic applications. Furthermore, apart from being toxic and pyrophoric, it has a low decomposition temperature (~180° C.), which could be a limitation for its use in the deposition of crystalline iron oxide films requiring high deposition temperatures. All the other iron precursors used for CVD are in the form of crystalline powder at room temperature. β-diketonate-based iron precursors have been the most widely reported sources for depositing iron oxide films: iron (III) acetylacetonate ($Fe(acac)_3$), ferric dipivaloyl methanate ($Fe(DPM)_3$), iron (III) t-butylacetoacetate ($Fe(tbob)_3$) and tris(trifluoroacetylacetonato) iron (III). $Fe(DPM)_3$ is also known as iron(III) tris(2,2,6,6-tetramethyl-3,5-heptanedionate) ($Fe(tmhd)_3$ or $Fe(thd)_3$) and its use for atomic layer deposition of iron oxide films has been reported recently. Besides being solid at room temperature, the β-diketonates suffer from potentially serious disadvantages; they undergo degradation easily in the delivery lines as well as under storage in the precursor vessel. Recently, solid iron tert-butoxide ([Fe($O^tBu$)$_3$]$_2$), which belongs to the alkoxide family, has been used as a single source precursor. More recently, Fe(II) dihydride complexes $H_2Fe[P(OCH_3)_3]_4$ and $H_2Fe[P(CH_3)_3]_4$ have been reported for MOCVD of iron oxide films. These precursors are not available commercially and, furthermore, $H_2Fe[P(OCH_3)_3]_4$ produced films that were amorphous and had phosphorus contamination. Among metallocenes, only $Fe(C_5H_5)_2$ has been reported for MOCVD applications, to the knowledge of the inventors. Though it had several advantages over the other precursors mentioned earlier, being a solid precursor it required a use of fluidized bed evaporator for its delivery to the reactor.

α-$Fe_2O_3$ thin films have been deposited on Si(100) substrates using n-butylferrocene and oxygen in a low-pressure metalorganic chemical vapor deposition reactor. The iron precursor is liquid at room temperature having a high enough vapor pressure; its thermogravimetric analysis shows that it undergoes clean evaporation without decomposition. The growth rates were studied in the temperature range of 400-600° C. The resulting thin films were characterized for structure and morphology using X-ray diffraction and scanning electron microscopy. Their composition was analyzed using energy-dispersive X-ray spectroscopy and chemical bonding states were probed using X-ray photoelectron spectroscopy. Films deposited at 450° C. were mostly non-crystalline and had carbon contamination. Films deposited at higher temperatures were crystalline α-$Fe_2O_3$.

Bismuth ferrite ($BiFeO_3$) is multiferroic, having a high ferroelectric Curie temperature and developing spiral-antiferromagnetic order below 643 K. It is unique because $BiFeO_3$ (BFO) is the only known single-phase material that is multiferroic at room temperature. Therefore, it has enormous potential for applications in spintronic devices, non-volatile ferroelectric random access memory, microwave technology, sensors and microactuators. MOCVD is also a preferred technique for BFO.

SUMMARY OF THE INVENTION

A preferred deposition system includes a reactor chamber, a plurality of reactant supply vessels, and a carrier gas supply. A supply line and valve set are in the system, the valve set including a plurality of actuated valves arranged to selectively bypass the reactant supply vessels and deliver carrier gas to the reactor chamber or carry reactant from the reactant supply vessels to the reactor chamber. Control software controls the actuated valves to selectively bypass one or both of the reactant supplies and deliver reactant from one or both of the reactant supplies. The system can conduct ALD or CVD deposition in the same reaction chamber and can switch between the deposition modes. The system is capable of depositing multi-metal films and multi-layer films of alternating ALD and CVD films. Reactant supplies can be bypassed with carrier gas flow to maintain pressure in a reactor and in reactor supply lines and purge reactants

BRIEF DESCRIPTION OF THE DRAWINGS

FIGS. 2A-2C illustrate example embodiment multi metal thin films of the invention;

FIGS. 3A-3B illustrate example embodiment multi-layer multi metal thin films of the invention; and FIGS. 4A-4B illustrate example embodiment alternating thin and thick film multi-layer structures of the invention;

FIGS. 5A and 5B illustrate control steps for operating the FIG. 1A deposition system to deposit $AO_x$ type films in an ALD mode;

FIGS. 6A and 6B illustrate control steps for operating the FIG. 1A deposition system to deposit $AO_x$ type films in a CVD mode;

FIGS. 8A and 8B illustrate control steps for operating the FIG. 1A deposition system to deposit $ABO_x$ type films in a CVD mode;

DETAILED DESCRIPTION OF THE PREFERRED EMBODIMENTS

Figure 1A:
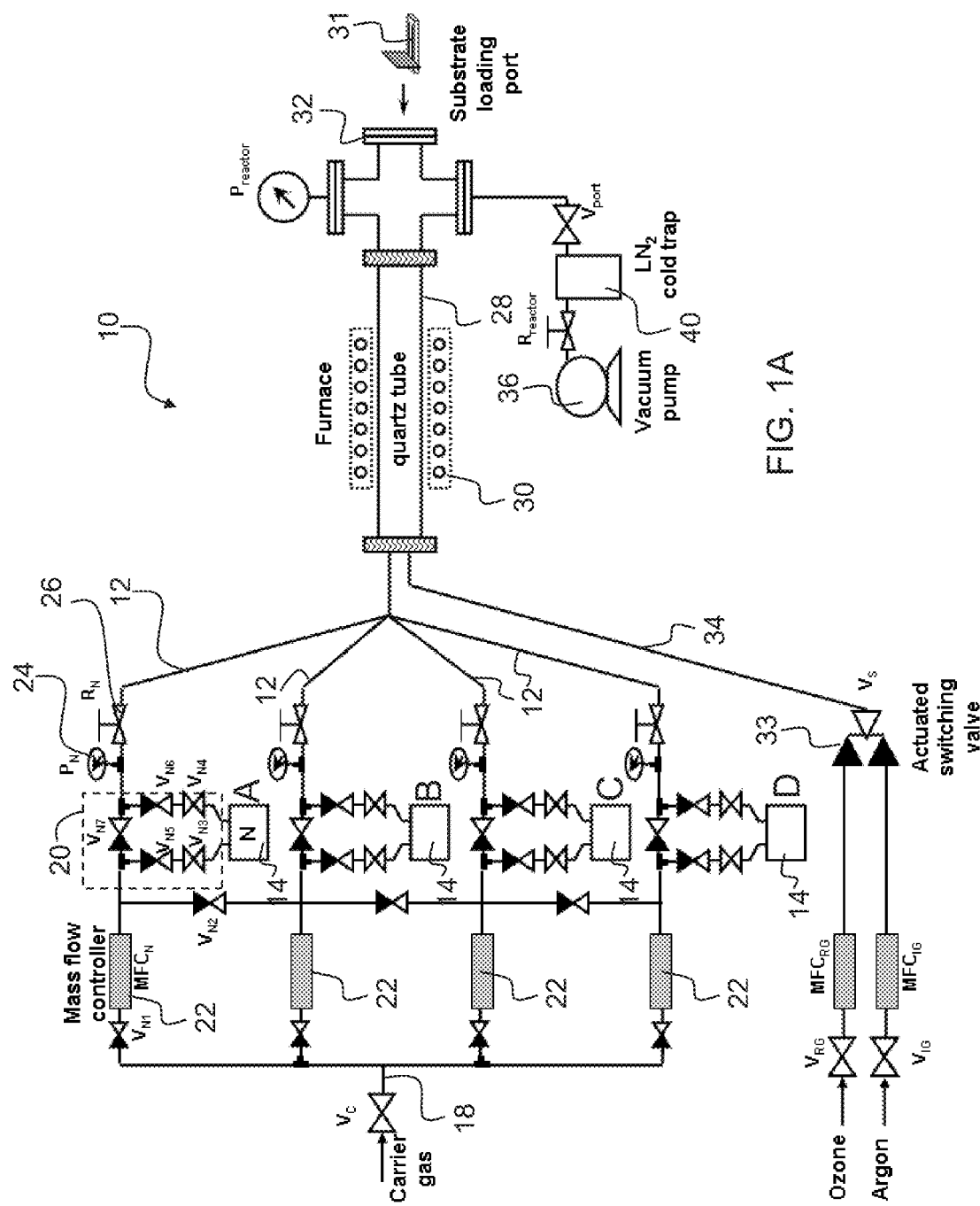
FIG. 1A is a general schematic diagram that illustrates a preferred embodiment deposition system that can form multi-metal thin films and alternating thick CVD (chemical vapor deposition) and thin ALD (atomic layer deposition) films, including valve labeling conventions and details for understanding control processes illustrated in FIGS. 6-11.

Preferred embodiment deposition systems and methods of the invention provide the ability to conduct high quality CVD and ALD in a signal chamber without breaking vacuum, and to grow high quality multi-layer films and multi-metal films by CVD or ALD or both. In a deposition system of the invention, valve bypasses and a control system permits maintaining a desired pressure reactor and also a desired pressure in the supply vessel. In preferred deposition systems of the invention, supply delivery lines can provide precisely timed introduction of reactants (precursors, reagents, and/or reaction gases) at developed predetermined pressures for a growth cycle or sub-cycle. Supply lines can be placed in a stand-by mode. While pressures are maintained, a cycle change can be achieved without delay to new reactants that were on stand-by mode to begin a different growth cycle. Developed pressures of reactants are introduced from stand-by mode. Multiple cycles of CVD or ALD and or CVD/ALD growth can be conducted, while growing high quality layers.

Preferred deposition systems also provide reactants at precise temperatures. In preferred embodiments, bubblers or sublimation vessel that supply reactants can be controlled to within 0.1° C. accuracy.

Deposition systems of the invention are capable of producing multi-layer films have sequential nano and micro layer thicknesses. These alternating thick-thin (i.e., micronano) laminated films structures are not believed to have been previously reported.

In preferred embodiment deposition systems and methods fast-actuating valves offer higher dosage precision compared to commercial systems in either ALD or CVD modes. When conducting ALD deposition, fine sub-monolayer controlled growth suited for depositing ultrathin films is achieved. When conducing CVD, higher growth rates can be achieved without compromising film quality. The ability of ALD/CVD cycling offers the uniqueness of bulk film capability with fine tuning of dopants and/or interfacial modifications. Deposition systems of the invention can be used to form films, multi-layer films and device structures that are infeasible to form with high quality with conventional systems. Particular example structures include a high quality CVD copper interconnect layer on top of an ultra-thin ALD adhesion layer formed without breaking the vacuum for BEOL application In an embodiment of the invention, a method uses the deposition system of the invention with a thermally stable and liquid at room temperature iron precursor n-butylferrocene for the MOCVD of $Fe_2O_3$ thin films at low pressure (e.g. 0.8 Torr). N-butylferrocene (($C_4H_9C_5H_4$)Fe($C_5H_5$)) is a ferrocene derivative and it exhibits good properties similar to those of ferrocene with the added advantage of being liquid at room temperature. This allows the use of the conventional simple and flexible bubbler type delivery scheme which can be used to deposit ferrites or other mixed iron oxides. Furthermore, n-butylferrocene is air- and moisture-stable, non-pyrophoric and has a sufficiently high vapor pressure.

The systems of the invention can also be used, for example, to use n-butylferrocene as a MOCVD liquid precursor for depositing iron oxide films. n-Butylferrocene is an air- and moisture-stable liquid precursor with good thermal stability and sufficiently high vapor pressure for use in MOCVD, and can be formed in multi-layer films with a system of the invention. The precursor is reported in M. K. Singh, Y. Yang and C. Takoudis, G., *J. Electrochem. Soc.*, 155, D618 (2008).

Preferred systems of the invention are also expandable. A system of the invention includes at least two supply lines to supply reactants to a reactor. However, additional supply lines can be added. Supply lines can also be active or inactive. The system can therefore be adjusted by activating or deactivating supply lines to conduct a CVD or ALD growth cycle with different numbers of reactants.

Deposition systems and methods of the invention can be used to form single component and multicomponent films. High quality single layer and multilayer films can be formed. Multi-metal films can be formed. The system can handle a wide variety of reagents. Example precursors include metalorganics and halides. Example reaction gases such as $O_2$, $O_3$, $H_2O$, $NH_3$ and $NO_x$, $H_2S$, $H_2$ and alcohols. Example carrier gases include $N_2$, Ar, and He. In addition to CVD/ALD cycling, preferred systems facilitate post growth processing, including annealing in various atmospheres, e.g., oxidizing, inert, reducing. The deposition systems provide general CVD and ALD capabilities, while also providing the advantages offered by the invention.

A wide variety of films can be formed in deposition systems of the invention. Example dielectric films include $SiO_2$, $HfO_2$ and $Al_2O_3$. Example ferroelectric films include $BaTiO_3$ and PZT. Example ferrite films include $NiFe_2O_4$, $CoFe_2$, $O_4$. Example magnetoelectric films include $BiFeO_3$ and $YMnO_3$. Systems of the invention can form metal oxides that have many applications in device structures. Systems of the invention can form metal films for interconnects and electrodes, metal nitrides for barriers and interconnects, and alloys for thermoelectrics. The example films are some that will particularly benefit from systems of the invention and/or are difficult/infeasible to form quality films with prior systems, but many other films can be formed including common films formed by conventional CVD and ALD systems.

Device fabrication will benefit from deposition systems and methods of the invention. Many devices can benefit from ALD and CVD layers. Examples include CMOS transistors, memory capacitors, ferroelectric random access memories, magnetoelectric random access memory, magnetoelectric devices, fuel cells, and thermoelectric generators, solar cells. Some of these devices will benefit from films and multi-layer films formed in systems of the invention that were difficult or infeasible to form as device quality films in conventional deposition systems.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

Figure 1B:
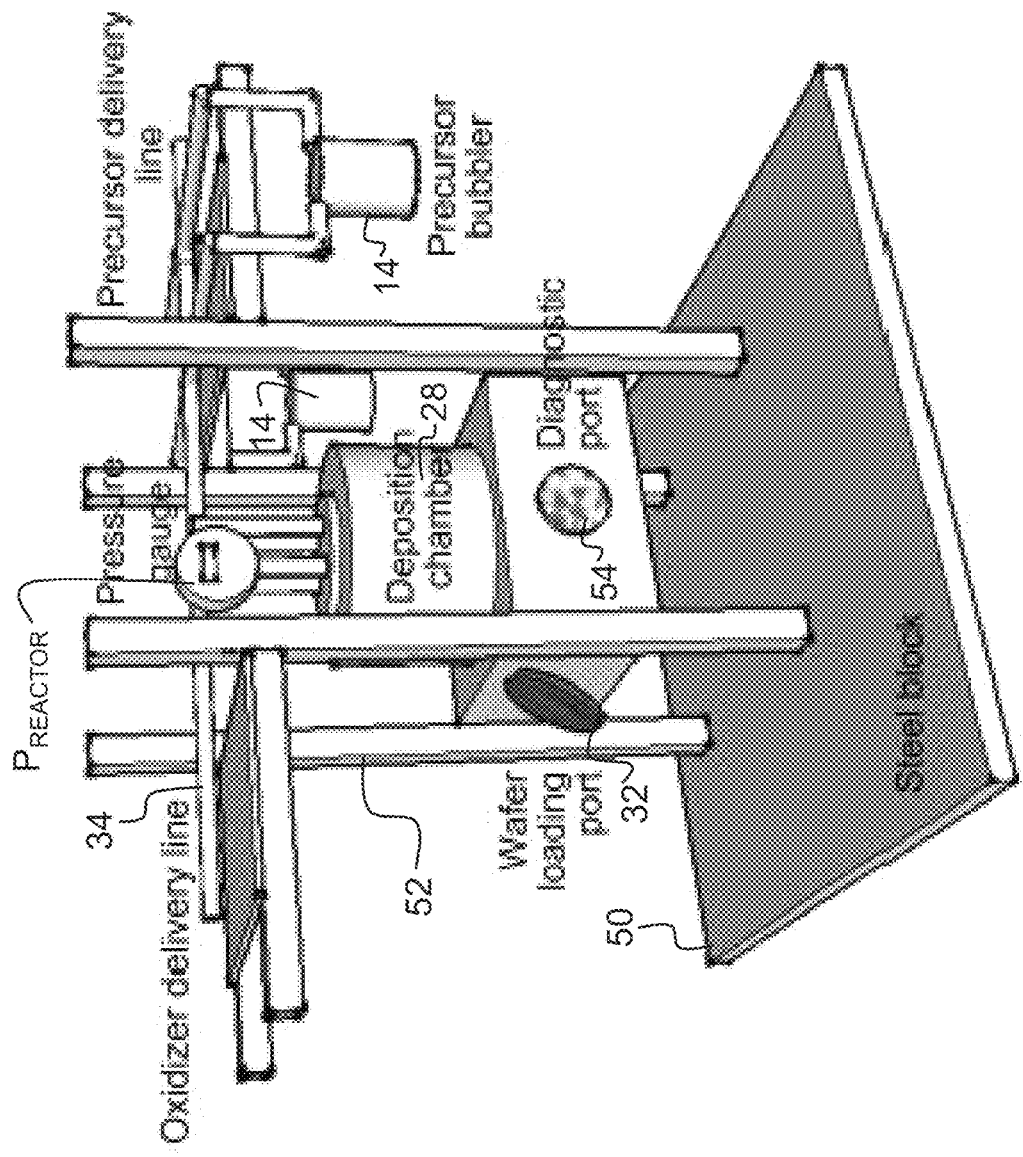
FIG. 1B is a perspective view of major components of an experimental portable laboratory deposition system constructed in accordance with FIG. 1A.

FIGS. 1A and 1B show a preferred embodiment deposition system 10 of the invention. The example system of FIG. 1A has four separate reactant supply lines 12 and the example of FIG. 1B has two reactant supply lines. In FIG. 1A, the reactant supply lines 12 can selectively supply reactants A, B, C, D (e.g. precursors) from reactant supplies 14. The reactant supplies are, for example, bubblers or sublimation vessels. In the example, there are four reactant supplies and four supply lines, but the system is expandable to include additional reactant supplies and supply lines, and other embodiments can include fewer supplies and supply lines. Carrier gas is introduced on a line 18 via a valve $V_c$. Each of the reactant supplies 14 can be bypassed by carrier gas via bypass controlled by a set 20 of bypass and reactant valves and supply line portions which are between the valves in the set 20 and extend back to mass flow controllers 22. For readability of FIG. 1A, the top set 20 of valves and supply line portions are identified. The valves of the set associated with reactant A are also labelled.

Valve labeling conventions from FIG. 1A are used in the description of preferred embodiment deposition methods that are illustrated in FIGS. 5A-10B. For the purpose of description of function and operation, the valves and fittings on one of the supply and bypass lines are labelled and the others are not to preserve readability of FIG. 1A, but the same convention can be assumed for the supply and bypass lines and valves for each of the reactants A, B, C, D. The other lines have identical valves and fittings and serve identical purpose. Each precursor line has a precursor vessel 14. The valves $V_{N3}$ and $V_{N4}$ of the set 20 on the reactant vessel have the primary purpose of isolating the reactant to prevent the exposure of the reactant to the ambient during installation, removal or changing of the reactor vessel 14 for a given reactant A, B, C or D, for example, for or after filling a precursor. The valves can be manual or actuated valves. Prior to a deposition process, these valves need to be opened. The valves $V_{N3}$ and $V_{N4}$ can be omitted in systems configured for a particular reactant that have no need to change the reactant vessel 14.

In an experimental system constructed in accordance with FIG. 1A, precursor supplies included four independent supply lines for delivering up to four precursors from four separate bubblers or sublimation vessels. The experimental bubblers were constructed with a ConFlat flanged cap that makes it easy to open and clean them as well as change out different precursors with no cross-contamination. Two different cap assemblies on the precursor reservoirs can be used to suit particular precursors. One has a dip-tube the other does not. The dip-tube version is best suited for liquid precursors while the latter is more useful for sublimation of solid precursors.

The valves $V_{N5}$, $V_{N6}$ and $V_{N7}$ are actuated valves and control the flow of the carrier gas either through the precursor vessel 14 or via bypass if the vessel via valve $V_{N7}$. Preferred actuated valves include pneumatic valves, such as bellow-sealed pneumatic valves. There are three states of operation: (1) flow through bypass, i.e. when valve $V_{N7}$ is open and both $V_{N5}$ and $V_{N6}$ are closed; (2) flow through precursor vessel, i.e. when valve $V_{N7}$ is closed and both valves $V_{N5}$ and $V_{N6}$ are open; and (3) no flow, i.e. when the three valves $V_{N7}$, $V_{N5}$ and $V_{N6}$ are closed. Valves $V_{N5}$ and $V_{N6}$ are operated in tandem; these valves are either both opened or both closed. The three valves $V_{N7}$, $V_{N5}$ and $V_{N6}$ should not be open at the same time. The valve $V_{N7}$ serves as a bypass valve and is advantageous for many reasons: it allows stabilization of flow profile and pressure before flowing the precursor during the deposition; it is critical in maintaining reproducible precursor dosage; and it allows easy and smooth switching from one precursor line to another as well as switching between ALD and CVD modes of operations. Also, in the ALD mode of operation, valve $V_{N7}$ can be used for purging the precursor in the purge precursor step. Having such a bypass scheme advantageously prevents wastage of precursor and does not require a precursor salvage unit.

The valve $V_{N1}$ when open allows the carrier gas to flow through precursor supply lines and hence selects which precursor(s) would be used for the deposition process. A mass flow controller $MFC_N$ 22 controls the flow rate of the carrier gas. A pressure gauge 24 $P_N$ measures the pressure inside the precursor vessel 14 during flow and a regulating valve 26 $R_N$ is used to regulate the pressure inside the precursor vessel 14. The temperature of the precursor vessel 14, the pressure inside the precursor vessel 14 and the flow rate of the carrier gas control the dosage of the precursor flowing into a reactor chamber 28. A furnace 30 heats a substrate 31 loaded in the reaction chamber 28 via a port 32. Alternatives for heating the substrate 31 include resistive heating or infra-red heating. The reaction chamber 28 that is shown is a single processing chamber. More than one reaction chamber and transfer chamber could be added as well. The supply lines 12 and reactor walls are preferably heated to a temperature substantially higher than the precursor bubbler 14 to avoid condensation of precursor.

There are also valves that interconnect supply lines 12 upstream of the reactant/precursor supplies 14 and the set 20 of bypass and reactant valves and supply line portions. The valves $V_{N2}$, when open, allows the carrier gas to flow through two or more precursor supply lines 12 through a common/shared mass flow controller. This arrangement is particularly useful when the deposition system is used in the ALD mode for depositing multi-element or multi-layered film structures. In this mode of operation, only one of the $V_{i1}$ (i=A, B, . . . ) valves is open while the rest of them are kept closed; in addition all $V_{i2}$ (i=A, B, . . . ) are kept open. Without the valve $V_{N2}$, switching from one precursor to another would be slow, rough and cause pressure fluctuations and irreproducibility in precursor dosages.

Valves $V_C$, $V_{RG}$ and $V_{IG}$ are ON/OFF valves for carrier gas, reaction gas (e.g., ozone) and inert gas (e.g. Argon), respectively. The carrier gas is typically an inert gas such as argon, nitrogen or helium but depending upon the process could be some other gas, such as hydrogen. The reaction gas is usually an oxidizer such as oxygen, ozone, water vapor, nitrogen oxide, hydrogen peroxide. However, depending upon the process, it could be a reducing gas such as hydrogen. The preferred deposition system could also be used for annealing between the deposition steps or after deposition; in those cases different processing gases such as ammonia, forming gas, oxidizing gas, reducing gas or inert gases can be flowed in to the reactor via valve $V_{RG}$. The inert gas flowing through $V_{IG}$ helps to control the reactor pressure and also functions as dilutor, depending upon the process needs.

An actuated switch valve 33 controls the reaction gas and inert gas to a secondary supply line 34. This valve (labelled $V_S$) can selectively allow either the reaction gas or the inert gas to flow in to the reactor depending upon the state of $V_S$. In an experimental system the valve $V_S$ was configured such that inert gas flows in when $V_S$ is OFF, while reaction gas flows in when $V_S$ is ON. $V_S$ can also be configured to include a plurality of, e.g., two (in the case of one reaction and one inert gas supply), actuated valves, one each for the reaction gas and the inert gas lines. This permits independent control of the reaction and inert gas supplies.

A regulating valve $R_{reactor}$ near a vacuum pump 36 controls pressure in the reaction chamber 28. The vacuum pump 36 is connected via a liquid nitrogen cold trap 40. The cold trap 40 prevents vapors from the reaction chamber 28 from reaching the vacuum pump 36. A valve $V_{port}$ is used to isolate the pump for loading and unloading of the substrate.

FIG. 1B shows selected major features of a particular example portable reactor system that is consistent with FIG. 1A and was constructed in experiments. Valves and smaller features are omitted to show the overall structure of the system. The system is mounted upon a steel block 50 and supported by steel framing 52. Apart from the structural framing, features of the portable reactor system that correspond to feature in FIG. 1A are labelled with the same reference numbers. A diagnostic port 54 allowed growth to be monitored. The entire reactor setup (which only included two reactant supply vessels that shared a bypass) weighs less than 40 lb and has a relatively small footprint of 8×9 in., making it compact and easy for transportation.

An experimental system consistent with FIGS. 1A and 1B was constructed and tested. Unique multi-layer and multi-metal films were fabricated. In the experiments, oxidant flow conditions and reagent delivery are controlled with software that drives the actuated valves to provide either continuous reagent flows for chemical vapor deposition or pulsating alternate cyclic flows for atomic layer deposition. The valve set 20 and bypass around each reagent supply 14 can be controlled to avoid undesirable pressure variation between modes or unexpected and unpredictable pressure and concentration fluctuations at the start of an ALD or CVD growth cycle. The supply system and control allows for alternating between the two modes of operation to result in thick-thin (i.e., micro-nano) laminated films structures that are not believed to have been previously reported.

Unlike conventional commercial systems, the FIGS. 1A and 1B deposition system is easily expanded to add more precursors or oxidizing reagents. The temperature of each bubbler can be controlled to within 0.1° C. accuracy using robust temperature controllers (microprocessor-based PID controllers) with uniform heating and exterior insulation. Temperatures of precursor vessels are critical as they strongly influence precursor dosage. In addition to temperature, the precursor dosage is controlled accurately by controlling bubbler pressure and the carrier gas (Ar or $N_2$) flow rate. Software control implements "recipes" to control valve sequencing to allow synthesis of different kinds of film structures under either CVD or ALD modes or combinations of both. Each precursor supply line may be operated independently or in tandem with one or more other lines in continuous or cyclic modes to deposit simple or multi-metal films or more complex structures such as multilayered stacks or nano-laminates such as shown in FIGS. 2-4. In FIGS. 2A-2C a substrate 60 includes a layer 62 deposited upon the substrate with a different number of reactants, ranging from two reactants/precursors (FIG. 2A) to four reactants/precursors (FIG. 2C) formed as dielectric layers with oxygen, and which can be multi-dielectric layers. Of course, different reaction gases ($O_2$, $NO_x$, $H_2$, $NH_3$) or mixtures can be introduced in the reactor through the gas feed-through. Dielectric films and semiconductor films can be formed with different precursors. Ozone produced from an ozonizer can also be used as oxidizer. FIGS. 3A and 3B illustrate multi-layer films having two thick (micro) films 62 with different precursors/reactants. FIG. 4A illustrates an alternating multi-layer thick (micro) 62 and thin (nano) 66 film structure with multiple thin films 66 of precisely controlled and different thicknesses and intervening thick films 62. FIG. 4B illustrate alternating thin (nano) films 66 that form unique multi-layer films.

Preferred deposition systems utilize fast-actuating bellow-sealed pneumatic valves which offer higher dosage precision in either ALD or CVD modes. While ALD provides fine sub-monolayer controlled growth and is more suited for depositing ultrathin films, CVD has the advantage of having higher growth rate without compromising film quality. The combination of ALD/CVD offers the uniqueness of bulk film capability with fine tuning of dopants and/or interfacial modifications.

As seen in FIG. 1A, separate Argon and Oxygen lines are switched into a reaction chamber by an actuator switching valve controlled by the control system software. A separate carrier (argon or nitrogen) line supplies carrier gas to four separate A, B, C, and D precursor supplies, which can be liquid or solid supplies. A bypass valve and flow permits switching of the supplies without creating a pressure change or build up that could affect the pressure and amount of precursor introduced into the reaction chamber when a precursor is switched back in. Any of the precursors A-D can be used in a pulsed ALD mode of operation or in a continuous CVD operation, and the bypass and supply system as shown in FIG. 1A maintains excellent ALD or CVD conditions for formation. As a result of the multiple supplies and controls, thin films of multiple metal oxides as well as thick films of multiple metal oxides can be formed as seen in FIGS. 2A-3B. In addition, variable thick and thin film alternating ALD/CVD structures such as shown in FIG. 4A or multiple distinct types and thicknesses of ALD layers as in FIG. 4B can be formed.

The invention also provides for metal oxide films and complex multi metal oxide thin films and multi-layer structures in accordance with variations of the FIGS. 2A-4B structures. In an embodiment of the invention, a fabrication method involves the use of a thermally stable and liquid at room temperature iron precursor n-butylferrocene for the MOCVD of $Fe_2O_3$ thin films at low pressure. N-butylferrocene (($C_4H_9C_5H_4$)Fe($C_5H_5$)) is a ferrocene derivative and it exhibits good properties similar to those of ferrocene with the added advantage of being liquid at room temperature. This allows the use of the conventional simple and flexible bubbler type delivery scheme which can be used to deposit ferrites or other mixed iron oxides. Furthermore, n-butylferrocene is air- and moisture-stable, non-pyrophoric and has a sufficiently high vapor pressure.

An embodiment of the invention uses a room-temperature liquid iron precursor, n-butylferrocene, to deposit polycrystalline $BiFeO_3$ films by metalorganic chemical vapor deposition. From x-ray photoelectron spectroscopy, the Bi/Fe atomic ratio is observed to be ~1. Electrical measurements show that the films exhibit ferroelectric characteristics at room temperature with negligible charge leakage. Magnetic measurements reveal a room temperature saturation magnetization of ~8 emu/cm$^3$, and provide evidence for a possible spin reorientation transition near 140 K. Data on magnetic field dependence of dielectric constant at 18 GHz provide evidence for magnetic-ferroelectric coupling in the film indicating potential for application in high-frequency tunable devices.

In the experimental system, LabVIEW software was programmed to control the deposition system. Other software platforms for implementation of control can be used, of course. In the experimental devices, the reactor was realized by a quartz tube that can be heated up to 1000° C. using a furnace (Marshall™ by Varian Inc.). The furnace temperature can be controlled to within 1° C. accuracy. The base pressure of the chamber is less than a few mTorr and the operating pressure can be controlled. One end of the quartz tube has a multi-port flange to allow loading the substrates, monitoring the pressure, and connection to the vacuum pump via a liquid nitrogen cold-trap. The other end of the tube has separate inlets for the precursors and the reactive gases. The use of independent lines for precursors and oxidizers prevents any reaction from taking place in the delivery lines.

FIGS. 5A through 10 describe the flow sequence and the program flow chart for some film structures that can be deposited in ALD and CVD modes. The flowcharts assume that the system is ready, i.e. temperatures of the precursor vessels, reactor and delivery lines are steady and at desired set points. Also, that the substrates have been loaded. In CVD modes the composition is controlled by controlling the temperature and pressure of the precursor vessel, while the overall thickness is controlled by the duration of the deposition process. The processes also are able to deposit multi-element films in both ALD and CVD modes.

FIG. 5A shows a single ALD growth cycle achieved by the control of FIG. 5B, which achieves a deposit of precursor $AO_X$. Valve opening step 70 opens valves to connect to precursor A and the ozone and argon of FIG. 1A. This step is not necessary when the precursor A has not been changed, disconnected, etc. Step 72 opens the valves to permit flow of the carrier through the bypass valve. The next step 74 involves pressure monitoring and waiting for flow and pressure to stabilize. After stabilization, a precursor pulse is applied 76 by opening valves to access the precursor vessel, and afterward the pulse the chamber is purged 78. An oxidizer pulse 80 is applied, and then the chamber purged 82. A decision 84 determined whether to conduct additional cycles. Optionally, the connection valves are closed 86 to permit changing or maintenance of the precursor A.

FIGS. 6A and 6B illustrate a CVD growth process to simultaneously introduce precursor A and oxidizer. Initial step 70 is the same as in FIG. 5B. Step 92 creates the carrier flow through the bypass and the oxidizer flow to the secondary supply line 34. Flows and pressures are monitored to stabilize 94. A precursor pulse is applied 96 with the bypass closed and maintained 98. The precursor valves are closed 100 and carrier redirected through bypass to maintain pressure. The oxidizer flow is stopped 102. Optionally, the precursor access valves are closed 104 with the closing of the bypass to stop carrier flow.

Figure 7A:
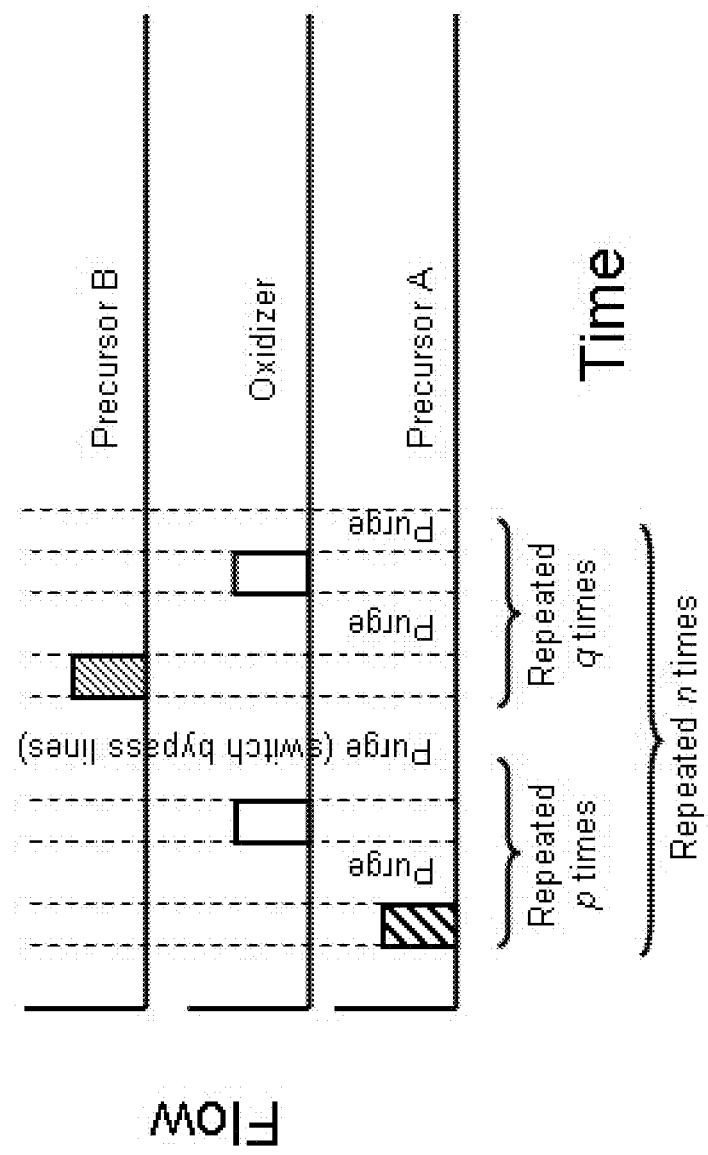
FIGS. 7A and 7B illustrate control steps for operating the FIG. 1A deposition system to deposit $ABO_x$ type films in an ALD mode.
Figure 7B:
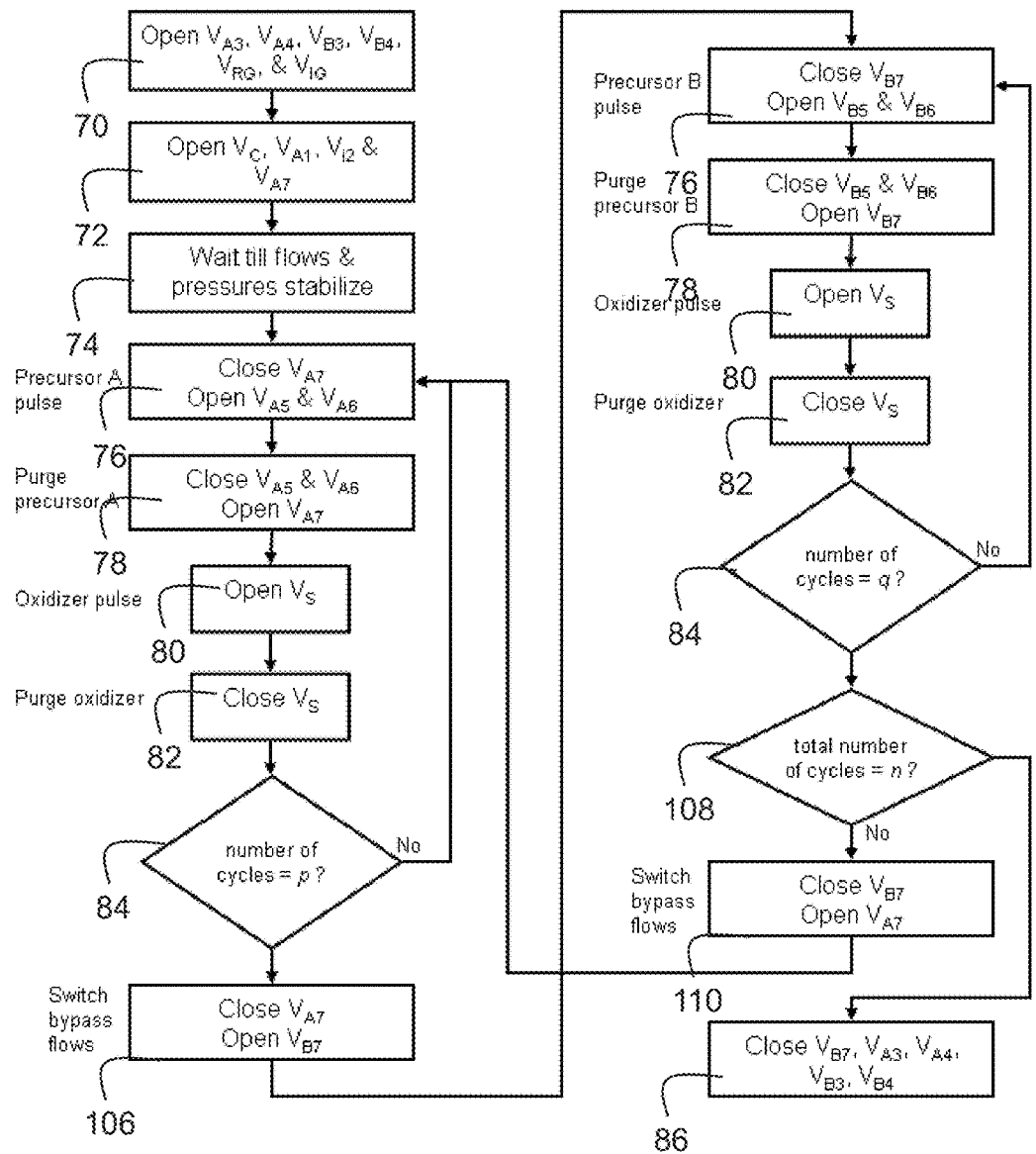

FIGS. 7A and 7B illustrate a process for an $ABO_x$ type of film deposit, which can be deposited in the ALD mode by the preferred deposition system. The process is for sequential cycles of precursors A and B and oxidizer. The process is similar to FIGS. 5A and 5B and similar steps are labelled with the same reference numbers. In Steps 70 and 72 the valves for the B precursor are added to establish and stabilize carrier flow and place both precursors in a ready state. The steps to apply a B precursor pulse correlate to the same steps for the A pulse and are labelled with the same reference numbers. Prior to the B pulse a step 106 switches from the supply line associated with precursor A to the B precursor. An added step 108 checks to see if a total number of cycles (A, B, Oxidizer) has been completed. Step 110 returns to the A pulse process. The composition is controlled by varying the number of cycles for each precursor, while the overall thickness of the deposited film is controlled by the total number of cycles in the outer loop as is shown in the program flowchart.

FIGS. 8A and 8B illustrate a CVD process that is the same as the FIGS. 6A and 6B, but with the valves also open for the B precursor, and the reference numbers from FIG. 6B are applied to the corresponding steps in FIG. 8B. Precursors A and B and oxidizer flow deposits a multi-element layer in the CVD mode.

Figure 9A:
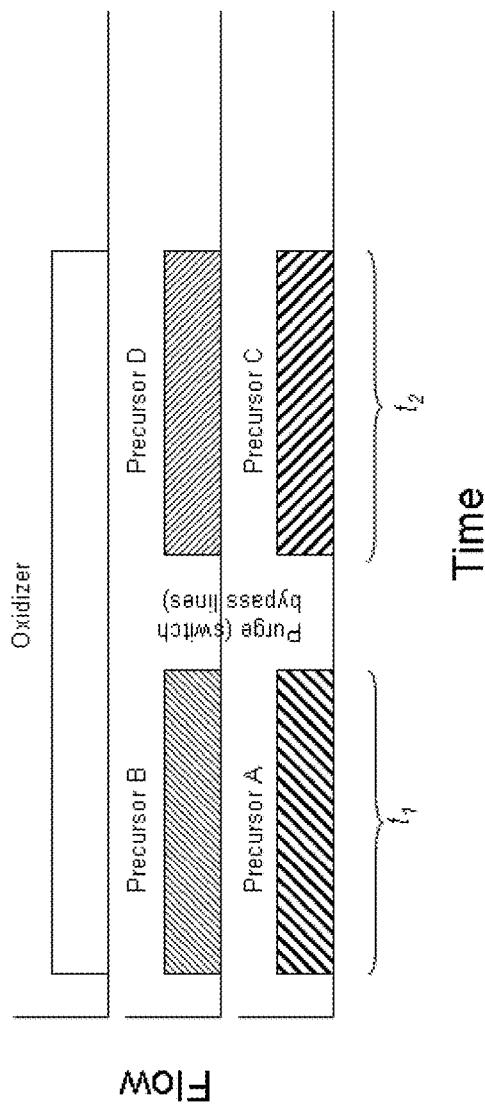
FIGS. 9A-9C illustrate alternative control steps for operating the FIG. 1A deposition system to deposit $ABO_x/CDO_x$ type films in CVD mode.
Figure 9B:
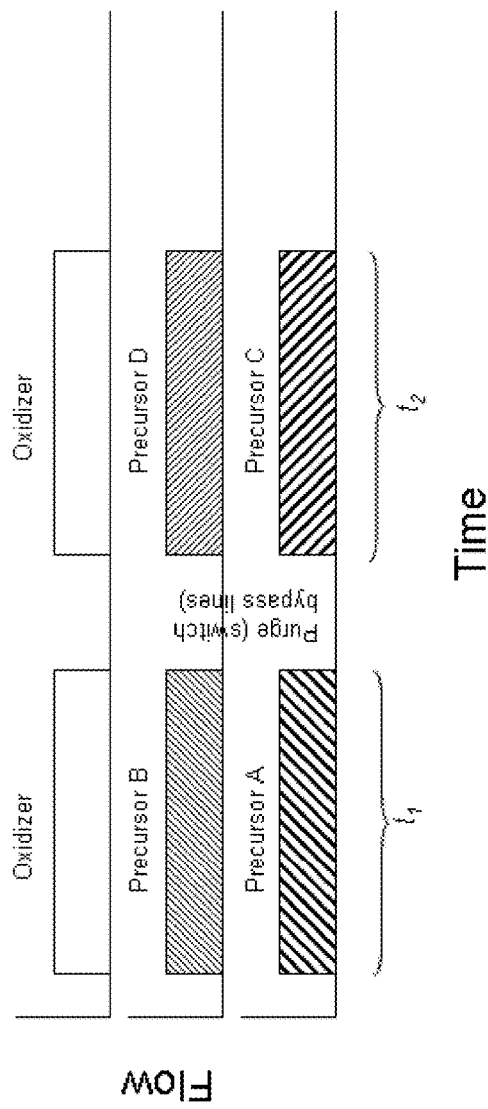
Figure 9C:
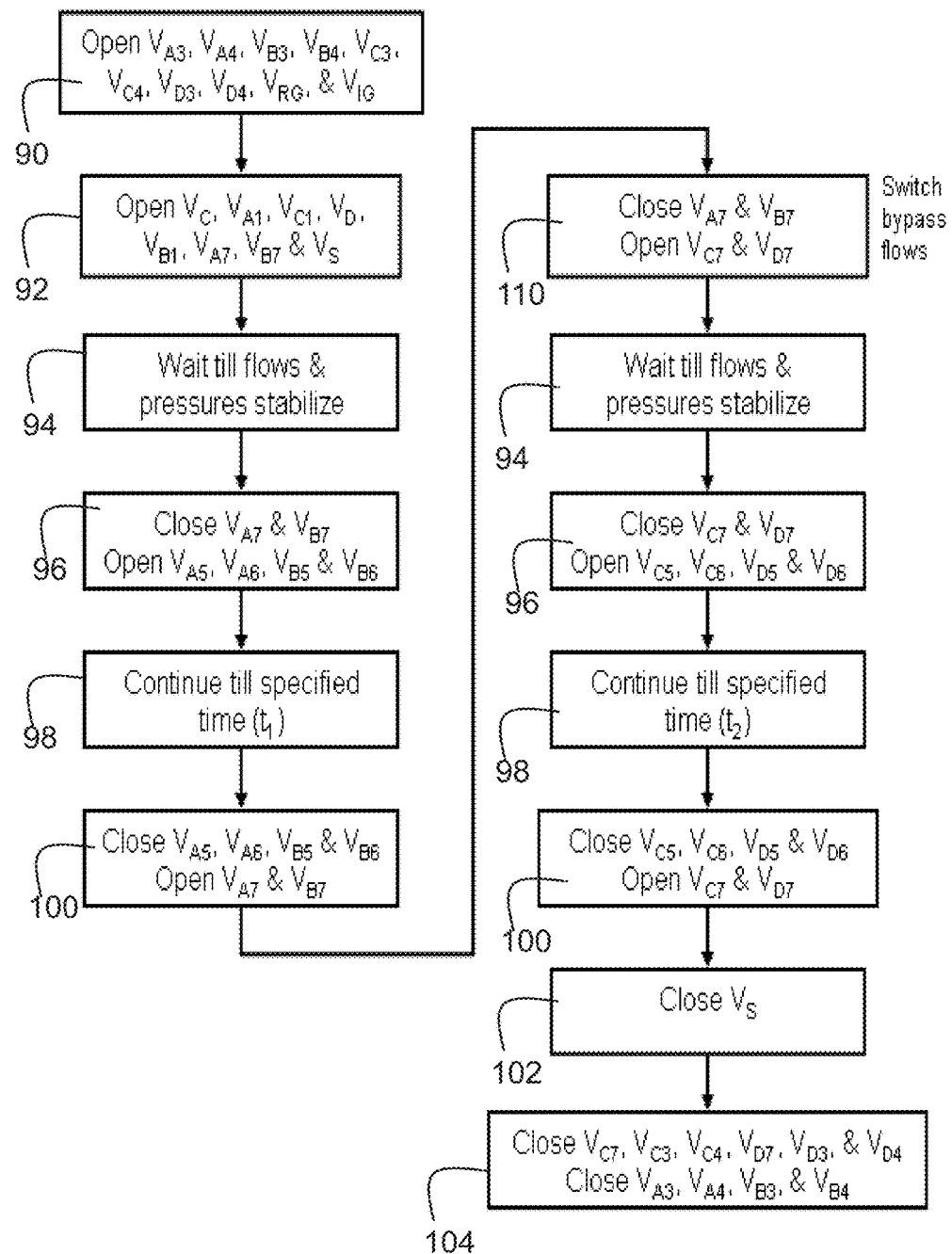

FIGS. 9A-9C illustrate a four precursor and oxidizer deposition sequential process in CVD mode, with FIG. 9A having a sequent of AB and then CD, and FIG. 9B the same sequence also including an oxidizer pause time with the switching of precursors. The basic process is similar to FIGS. 8A and 8B with the addition of comparable steps for the CD deposit, and a switch step 110 to switch from the AB supply lines to the CD supply lines.

Figure 10A:
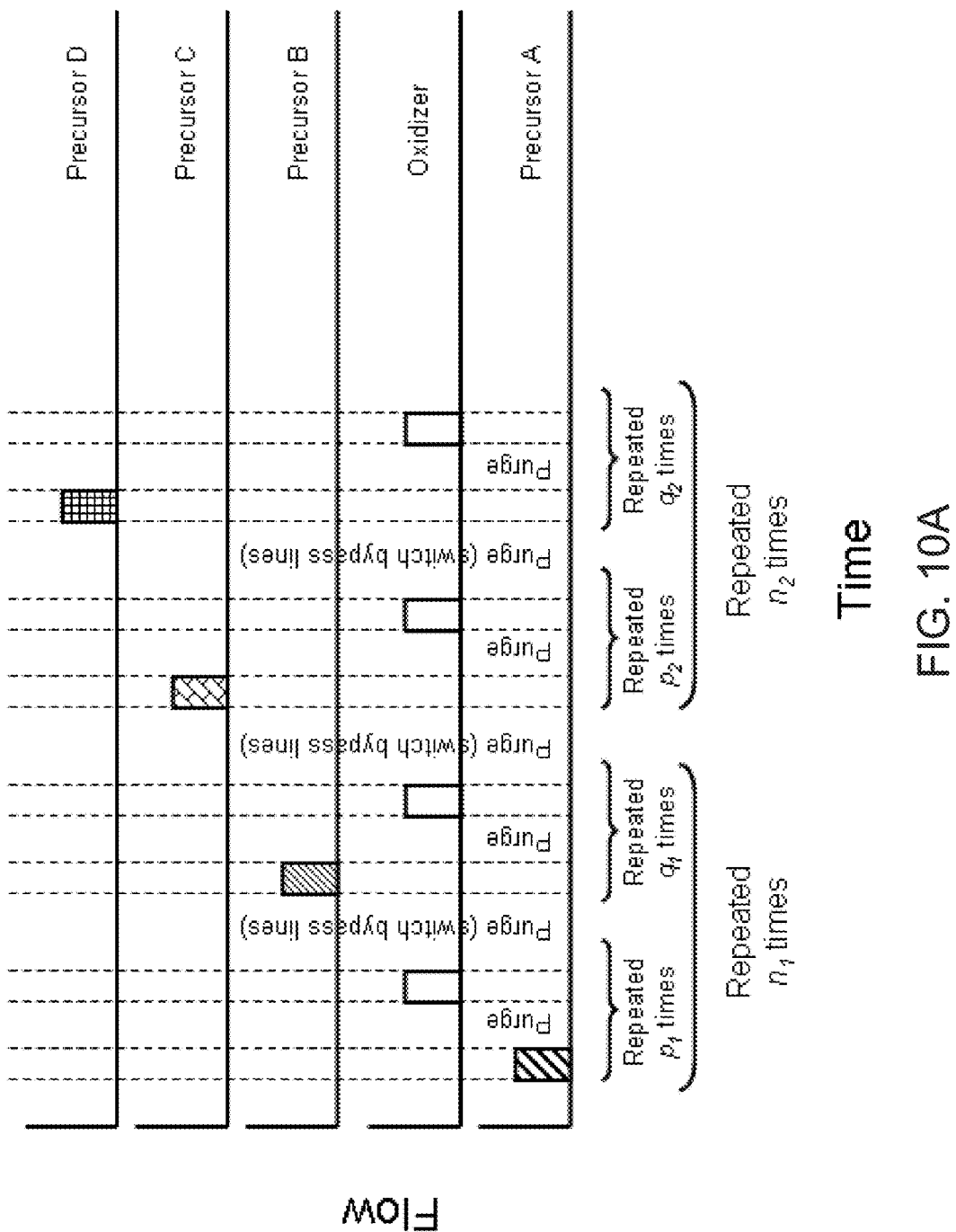
FIGS. 10A and 10B illustrate control steps for operating the FIG. 1A deposition system to deposit $ABO_x/CDO_x$ type films in ALD mode.
Figure 10B:
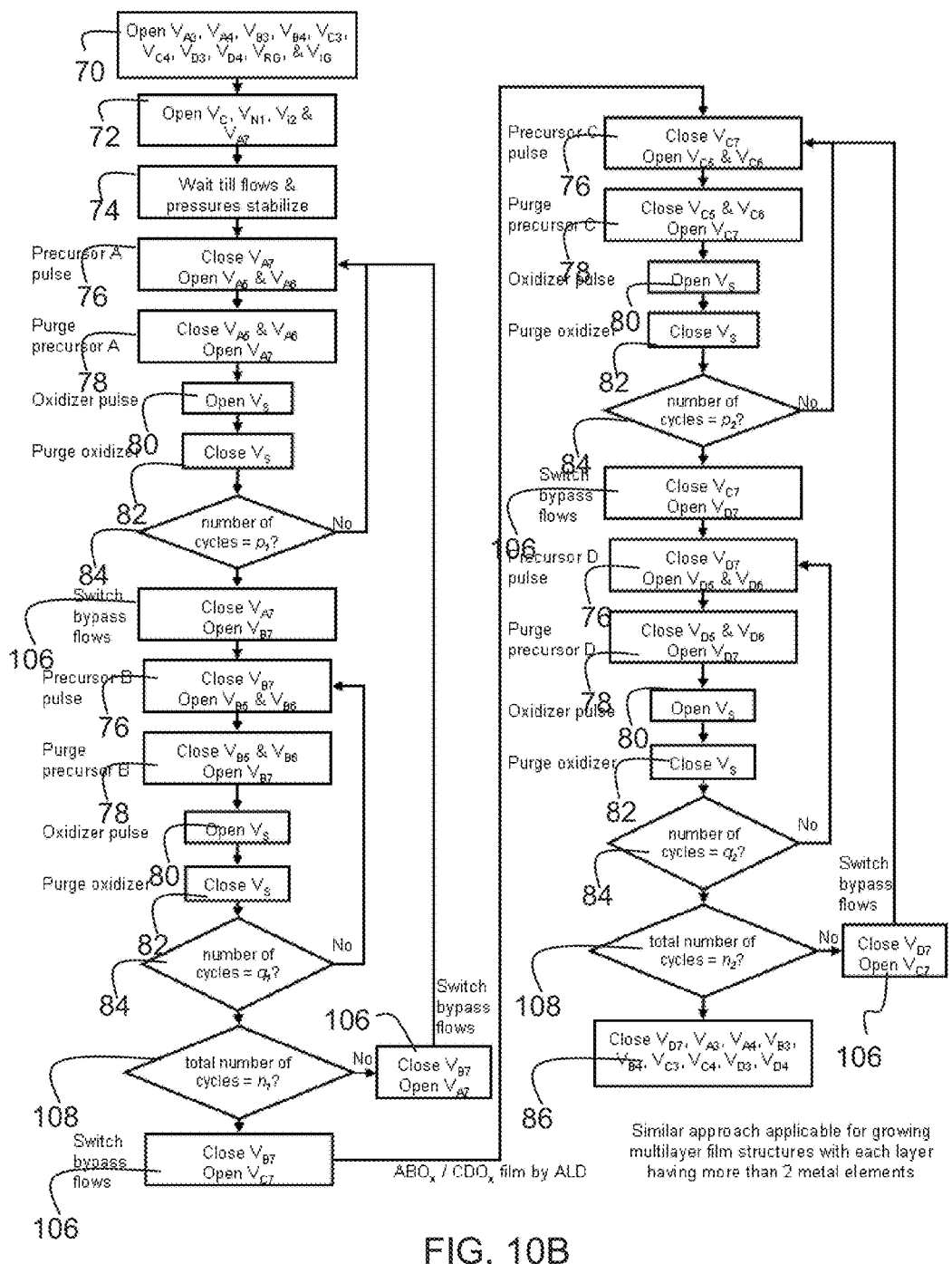

FIGS. 10A and 10B illustrate a process for sequential deposit of bilayer film structures by an ALD mode, for example with each layer having two metals. The process is similar to the ALD process of FIGS. 7A and 7B, with added cycles and valve control for additional precursors for sequentially forming the AB then CD bilayers.

The processes and deposition systems provide ALD/CVD and multilayer depositions. Bilayer structures in which each layer has more than two metals can be deposited. Multilayered structures where each layer has one or more than one metals can be deposited. The process above can be combined sequentially together for depositing structures in which some layers are deposited in ALD mode while others are deposited in CVD mode, some of one, two or more metals and others have a different number. The system and process and also form semiconductors such as ZnS, and to deposit multi-metals, metal oxides, metal nitrides, metal sulfides and metal carbonates.

Experiments have formed such films. Example films of interest include:
 1. $Fe_2O_3$ data could be used to represent the CVD of $AO_x$ type films.
 2. $BiFeO_3$ data could be used to represent the CVD of $ABO_x$ type films.
 3. $HfO_2$ data could be used to represent ALD of $AO_x$ type films.
 4. $Y_2O_3$—$HfO_2$ data could be used to represent ALD of $ABO_x$ type films
 5. $BiFeO_3$—$BaTiO_3$, $NiFe_2O_4$—$PbZr_xTi_{1-x}O_3$ for magnetoelectric applications Preferably, the flow rates of the carrier gas in each precursor line are set to the same value. The precursor dosage is controlled by controlling precursor vessel temperatures and the precursor vessel pressures. The flow rate of the reaction gas (i.e. $MFC_{RG}$) and dilutor gas (i.e. $MFC_{IG}$) could be set to values different from those for precursor lines. Such an arrangement makes all lines identical. The same setup could be modified for other delivery schemes such as direct-liquid injection by, for example, using precursor vessels as flash vaporizer.

First Example Deposition Experiments and Results

N-butylferrocene (purity 99%) was purchased from Strem Chemicals. It is an orange-brown air- and moisture-stable liquid with a vapor pressure of 0.026 Torr at 60° C. Thermogravimetric analyses (TGA) were done using Cahn TG-131 at a ramp rate of 5° C./min in 570 standard cubic centimeters per minute (sccm) $N_2$ flow.

Thin film depositions were done in a horizontal hot wall low pressure MOCVD reactor consisting of a quartz tube 38 mm in diameter and 48 cm long). The system was similar to FIG. 1A but had fewer precursor bubblers and supply lines. The base pressure of the system was 10 mTorr. The reactor has a dual-tube gas feed through connected on one side that allows the precursor and oxygen (99.999% purity) to be introduced separately into the reactor. The quartz tube is encased in a furnace (Model 1043 Marshall, ThermCraft, Inc.), which could heat the tube up to 1000° C. Argon (99.999% purity) was used as the carrier gas for the iron precursor. Typical flow rates used were 35 sccm for argon and 40 sccm for oxygen. Argon at 60 sccm was used as a diluent. The precursor bubbler was kept at 80° C. and the delivery line section from the bubbler to the reactor was maintained 10-15° C. higher than the bubbler temperature to ensure there was no condensation of the precursor during the delivery. Based on these flow rates and the precursor bubbler temperature, the number of oxygen molecules per molecule of precursor was estimated to be 80. The depositions were done at a total pressure of 800 mTorr and in the temperature range of 400-600° C.

The films were deposited on p-type Si(100) substrates. The substrates (1.5 cm×2 cm) were placed on a quartz boat perpendicular to the longitudinal axis of the reactor. For the probing of the growth rates, films were deposited in a step pattern using a shadow mask. The step height of the formed pattern was then measured using a Tencor P-1 profilometer.

The structure and morphology of the deposited films was analyzed using a Siemens Diffraktometer D5000 in the powder diffraction mode with nearly monochromatic Cu Kα ($\lambda_{K\alpha 1}$=1.540 Å and $\lambda_{K\alpha 2}$=1.544 Å) X-rays. The measurements were performed at the setting of 40 kV and 30 mA in the detector range 40°<2θ<60°. The scan step was 0.02° with a 1 s dwell. The peaks were identified using the International Centre for Diffraction Data (ICDD) database of diffraction pattern Powder Diffraction Files (PDF).

Film composition and morphology were studied in a Hitachi S-3000N scanning electron microscope (SEM) employed with an Oxford Inca Energy Dispersive X-ray spectroscopy (EDX) system. The analysis was done at 20 kV accelerating voltage.

Thermogravimetric Analysis.

Figure 11:
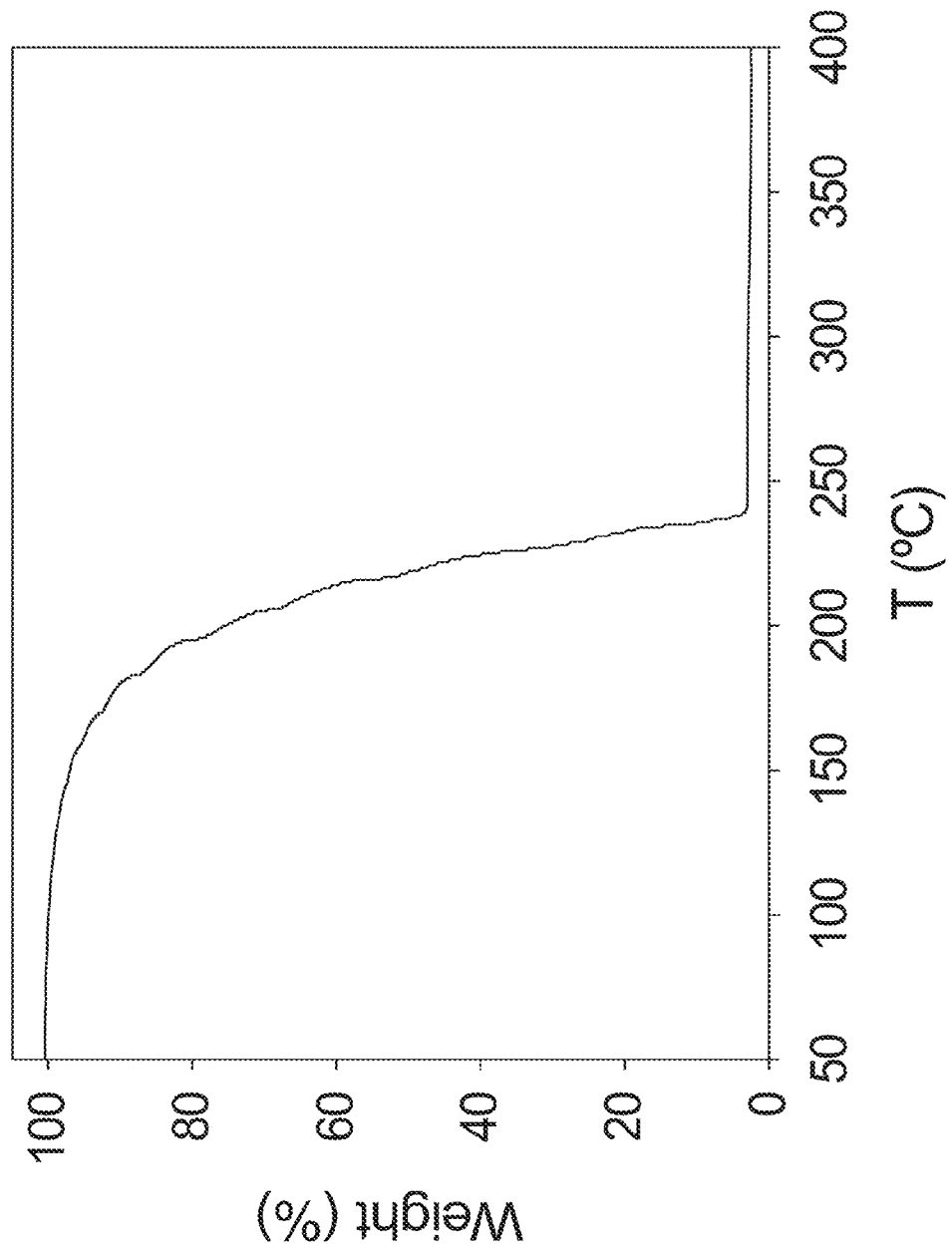
FIG. 11 presents data from thermogravimetric analysis (TGA) data for n-butyferrocene with growth temperature ramped at a rate of 5° C./min.

TGA data for n-butylferrocene is shown in FIG. 11. N-butylferrocene completely evaporates in a single step at about 240° C. leaving behind almost no residue (<2%). This indicates a clean evaporation without any decomposition. This thermal stability ensures that the precursor would neither decompose while flowing through the delivery lines nor would it degrade in storage. Also, since no residue is left behind, the precursor can be used very efficiently. Its thermal decomposition behavior in this sense is very similar to that of ferrocene. Ferrocene is a crystalline powder which undergoes complete sublimation in a clean single step but at the lower temperature of 175° C. The higher evaporation temperature in the case of n-butylferrocene may be attributed to the bulky alkyl ligand attached to one of the cyclopentadiene rings. The n-butyl ligand could also be responsible for the lower vapor pressure of n-butylferrocene than that of ferrocene. In contrast with n-butylferrocene and ferrocene, other precursors undergo evaporation with decomposition or multistage decomposition and/or leave behind substantial residue (e.g., 23% and 70% in case of, $Fe(acac)_3$ and [Fe$(O^tBu_3)]_2$, respectively). Ideally, all precursor should be able to get vaporized and transported to the reactor before it starts to decompose.

Growth Rate

Figure 12:
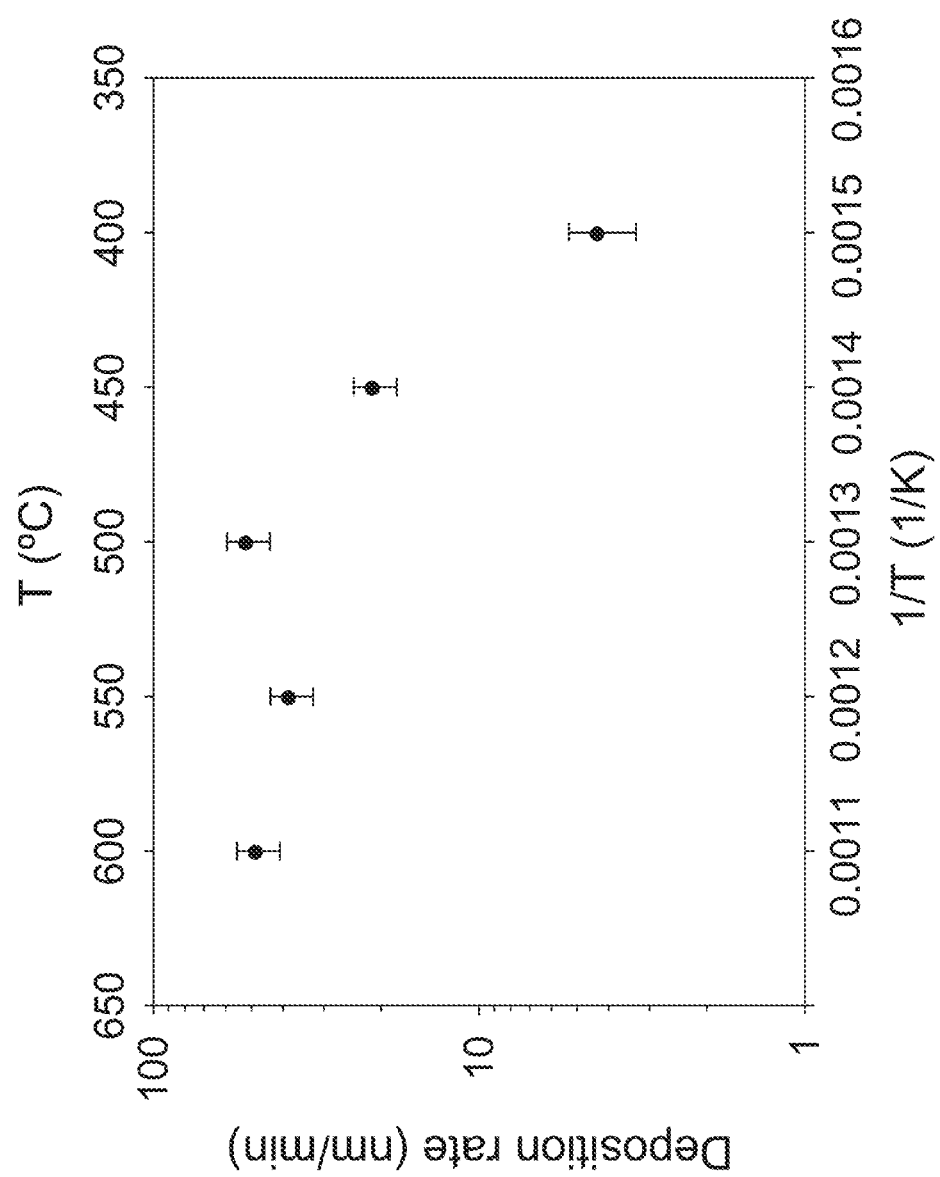
FIG. 12 presents data of iron oxide growth rates using n-butylferrocene and oxygen at a total pressure of 800 mTorr with precursor was kept at 80° C. and carrier gas and oxygen flow rates of 35 sccm and 40 sccm, respectively.

Thin iron oxide films were deposited for 30 min at different temperatures. Constant mass flow rates for the precursor and oxidizer were used. For all experiments, the substrates were oriented perpendicular to the direction of flow of the precursors. Films deposited at 400 and 450° C. were slightly flaky and broke off the substrate from some parts. Films deposited at higher temperatures adhered well to the substrate. From the Arrhenius plot shown in FIG. 12, two different growth rate regimes could be observed for the range of deposition temperatures studied. For temperatures below 500° C. the growth rate increased rapidly with increasing temperature indicating a kinetically-controlled regime. The activation energy computed from the slope of the curve is approximately 105 kJ/mol. Pflitsch et al obtained an activation energy of about 75 kJ/mol from iron oxide deposition experiments using ferrocene. C. Pflitsch, D. Viefhaus, U. Bergmann, V. Kravets, H. Nienhaus and B. Atakan, *J. Electrochem. Soc.*, 153, C546 (2006). The growth rates in the second regime (i.e., higher than 500° C.) were almost temperature-independent. This indicated that the deposition in this regime is mass transfer-controlled. Deposition rates in the present study using n-butylferrocene and oxygen range from about 4 nm/min at 400° C. (in the kinetics-controlled regime) to 50 nm/min at temperatures above 500° C. (in the mass transfer-controlled regime).

Structure and Morphology of the Films.

Figures 13A, 13B, 13C, 13D:
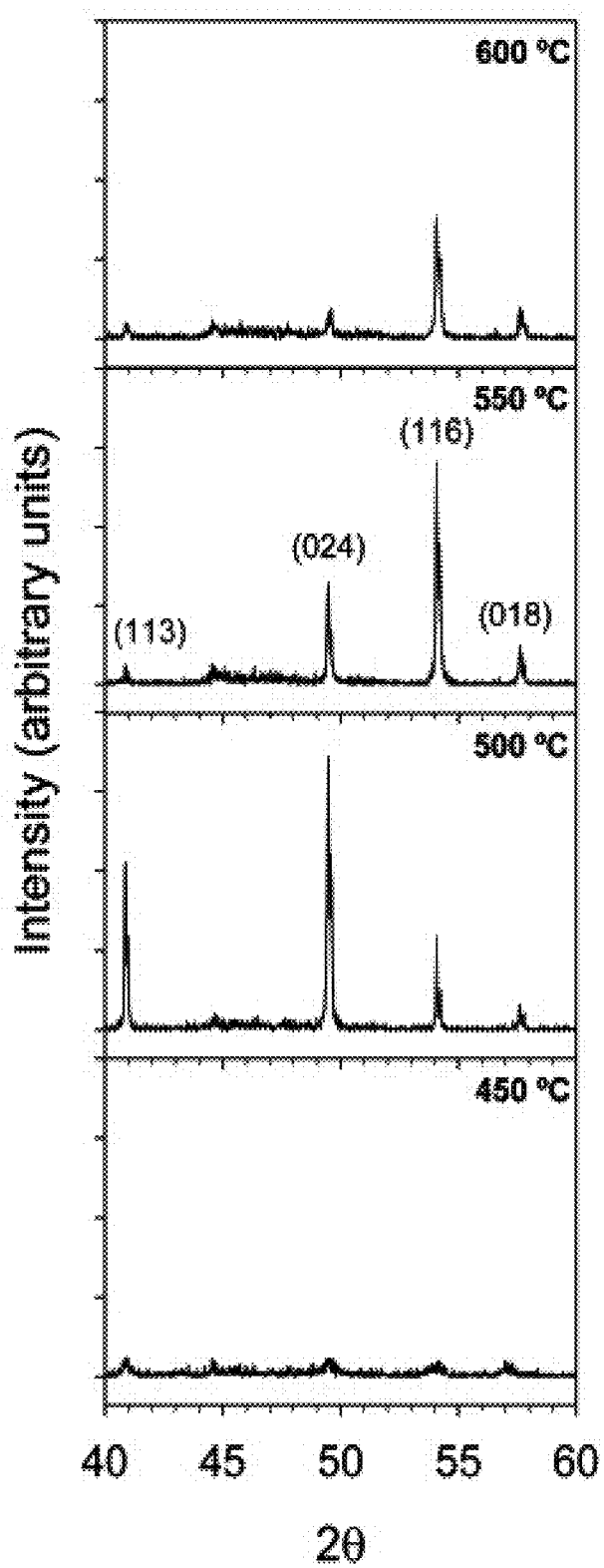
FIGS. 13A-13D are X-ray diffraction data for thin iron oxide films deposited on Si (100) substrates at (a) 450° C., (b) 500° C., (c) 550° C., and (d) 600° C. for 180 min with other growth conditions as in FIG. 12 data.

For studies on the phases of iron oxide present in the deposited films, films were grown for 180 min at temperatures 450-600° C. In order to exclude interference from peaks of the substrate, the X-ray diffraction (XRD) scan was done in the region of 40°≤2θ≤60°. From the small intensities of the peaks in the diffraction spectrum shown in FIG. 13A, it could be inferred that the film deposited at 450° C. had very low crystallinity. The peaks at 40.85°, 49.48°, 54.09° and 57.59° corresponding to $Fe_2O_3$ [PDF#33-0664] reflection planes (113), (024), (116) and (018) were observed. No other additional peaks from other phases were observed indicating that the films are single-phase α-$Fe_2O_3$. This may have been expected because the oxidizing atmosphere used for the deposition would preferentially lead to formation of α-$Fe_2O_3$ which is the most stable phase at high oxygen pressure and high temperature. At 500° C., the deposited films were highly crystalline with strong peaks corresponding to the preferred orientations (113), (024), (116) and (018) (FIG. 13B). At higher deposition temperatures the relative intensity of the (113) reflection diminished considerably indicating changes in the structure of the deposited films. The films were still crystalline α-$Fe_2O_3$ but the strongest reflection intensity changed from the preferred orientation (024) to that of (116) (FIGS. 13C and 13D). This indicates a change in the preferential growth plane due to different crystal energy. Other data showed that the preferred growth orientation changes from mostly (024) and (113) at 500° C. to mostly (116) and (018) at 600° C. However, this change appears to take place through a transition at 550° C. where, although $TC_{(116)}$ is maximum, $TC_{(024)}$ is also not diminished. $TC_{(hkl)}$ is the texture coefficient of the plane (hkl).

SEM images showed that Small-sized crystallites could be observed in the SEM image for the film grown at 450° C. This is in agreement with the XRD data where low degree of crystallinity was observed for these films. The crystallites developed into large (2-3 μm long) thin overlapping plate-like structures at 500° C. At 550° C., the thickness of the plates increased along with an apparent change in the morphology. For the films grown at 600° C., the shape of the crystallites had changed from overlapping plate-like structure to closely packed crystallites with random shapes. This corroborates the XRD patterns and texture coefficient variations in which films grown at 600° C. showed mainly a strong (116) orientation in comparison with films deposited at lower temperatures. The finding that the shape and orientation of crystallites deposited at 600° C. is so different from those of the other films again supports the assertion (corroborated by XRD data) that there is a change in the preferential growth plane at higher deposition temperature.

The composition of the as-deposited films was analyzed using EDX. The films deposited at 450° C. were found to have about 8% carbon impurity. This suggests that such a deposition temperature was likely not high enough to result in the decomposition of the precursor and removal of the resulting volatile organics, for the reaction chamber conditions used. The films deposited at higher temperatures had no detectable carbon contamination and the stoichiometry, within the limit of the accuracy (~5%) of the technique, was close to that of stoichiometric $Fe_2O_3$. This indicates that at these deposition conditions the organic ligands in the precursor molecules cleave cleanly during the deposition process.

Figure 14:
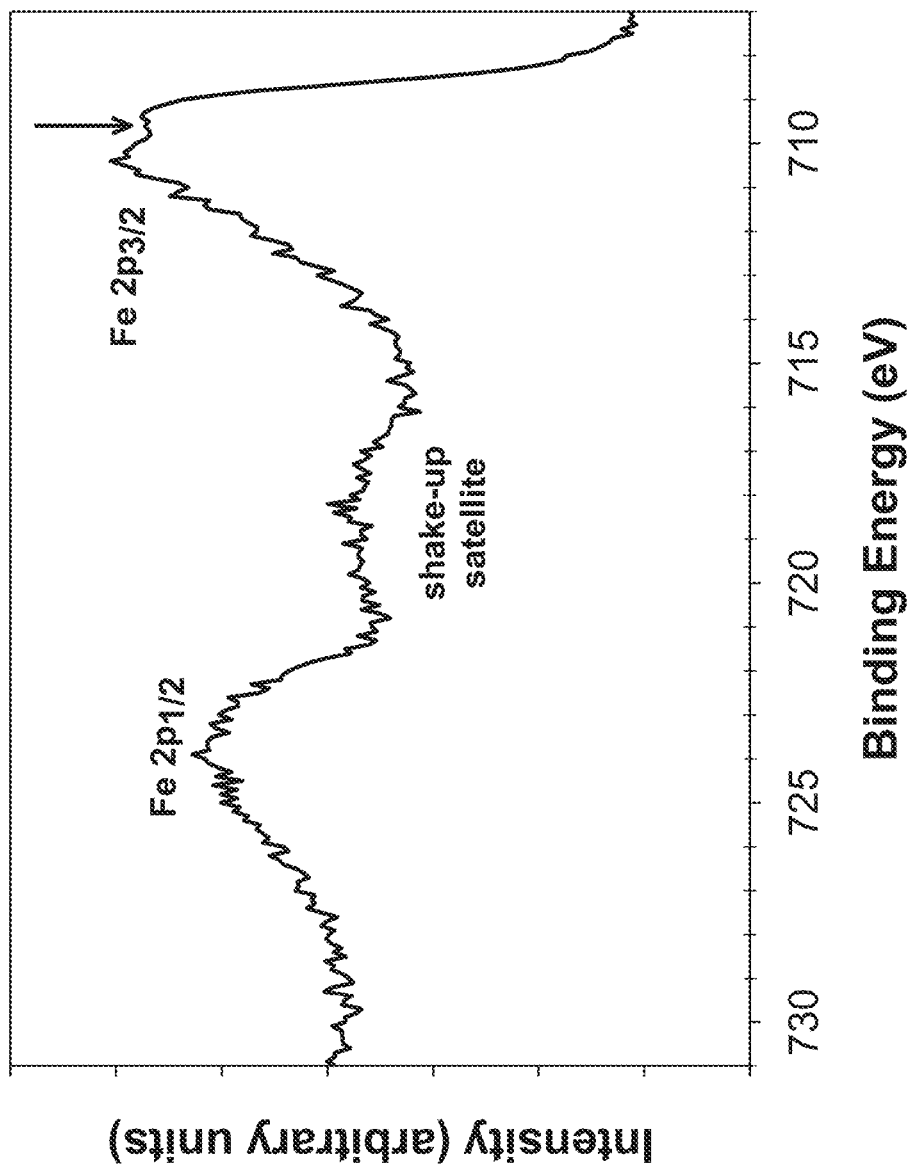
FIG. 14 are data of the Fe 2p core XP spectrum of an iron oxide film deposited at 500° C. and 800 mTorr, showing a small step present on the $Fe_2p_{3/2}$ peak which is indicative of $\alpha$-$Fe_2O_3$.

X-ray photoelectron spectroscopy showed the typical Fe 2p core spectrum for the deposited films. The Fe $2p_{3/2}$ and Fe $2p_{1/2}$ peaks are located at about 711 and 725 eV, respectively. There is a shake-up satellite at 719 eV that is indicative of the $Fe^{3+}$ oxidation state. There is also a small step (indicated by arrow) in the $Fe_2p_{3/2}$ peak which, in the literature, has been reported to be characteristic for $\alpha$-$Fe_2O_3$. The data are shown in FIG. 14.

Second Example Deposition Experiments and Results

The experimental system in accordance with FIGS. 1A and 1B will be described. Additional features of the invention will be apparent to artisans, while details of the experimental system do not limit broader aspects of the invention.

Deposition Chamber

The deposition chamber is a hot-wall, perpendicular-flow, aluminum chamber with optical diagnostic access. The chamber walls are heated by cartridge heaters and electrical heating tapes. The wafer stage is heated separately by two cartridge heaters located within the wafer stage, outside of the vacuum chamber. The precursors are kept in stainless steel (SS) bubblers and transported to deposition chamber through heated stainless steel tubes. The temperature is measured using glass braid insulated type-K thermocouple having accuracy of 2.2° C. The system temperature is controlled by a single 6-zone proportional-integral-derivative controller (CN616, Omega Engineering Inc.). The heating power controller consists of six solid state relays housed together in a grounded steel enclosure for portability. The reactor walls and delivery lines are heated ~30° C. above precursor bubbler temperature to avoid precursor condensation. The wafer stage, delivery lines and precursor bubblers can be heated up to 450° C. High purity nitrogen (99.998% purity) is used to carry precursor vapor from the bubbler to the deposition chamber and to purge precursor/oxidizer out of the deposition chamber. A two stage, oil sealed rotary vane pump (Edwards Vacuum Inc.) is used with zeolite fore line trap (13×10 Angstrom; ⅛ in. pellets; Kurt J. Lesker Company). The zeolite trap prevents pump oil from back streaming into the deposition chamber as well as avoids precursors from getting into the pump. A manual ball valve is installed between the vacuum pump and the deposition chamber to isolate the deposition chamber during sample transfer and to regulate chamber pressure during deposition. A flexible, 1 m long, SS unbraided hose is used between pump and chamber to prevent pump vibration from reaching deposition chamber. The system has a base pressure of less than 40 mTorr and typically the ALD/CVD deposition is carried out at 500 mTorr. The deposition chamber is equipped with two pressure gauges covering the ranges of $1\times10^{-3}$-2 Torr range (Varian 801, Varian Inc.) and 1-760 Torr range (Series 902 Piezo transducer, MKS Instruments).

Precursor Supply Lines

Figure 15:
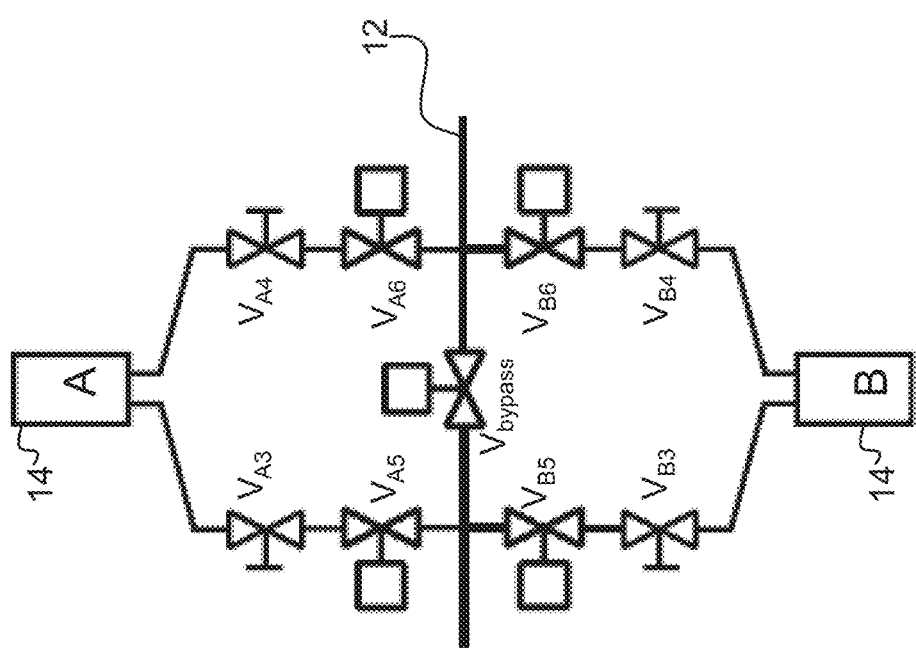
FIG. 15 illustrates a shared bypass arrangement for two precursor supply lines that was used in an experimental two precursor system in accordance with FIG. 1A and FIG. 1B.

Precursor supply lines are carefully designed to accommodate ALD & CVD modes, minimize cost, improve compactness & facilitate portability. The system has two delivery lines with a common by-pass line. Each line has two bellow-sealed pneumatic valves; Model: SS-BNVV51-C, Swagelok) and two manual plug valves; Model: SS-4P4T, Swagelok) arranged consistent with the system in FIG. 1A. However, only two precursors were used, and the two precursors shared a single bypass valve and used a single precursor supply line into the reaction chamber. This bypass arrangement is shown in FIG. 15 with reference numbers from FIG. 1A applied to common parts. Manual plug valves are used to protect air-sensitive precursor from coming in contact with air during precursor transfer. Oxidizer delivery is controlled by a 3-way bellow sealed switching valve; Model: SS-4BY-V35-1C, Swagelok). In ALD mode, valves $V_{A5}$&$V_{A6}$ for line A or $V_{B5}$&$V_{B6}$ for line B are opened momentarily, followed by precursor purging, oxidizer pulse and oxidizer purge steps in a cyclic manner. $V_{bypass}$ valve in bypass line is opened for precursor purging and oxidizer purging steps, whereas a valve for the oxidizer (see, e.g. FIG. 1A) is opened for the oxidizer pulse step. For CVD mode, $V_{A5}$&$V_{A6}$ for line A or $V_{B5}$&$V_{B6}$ for line B are opened along with oxidizer valve (see FIG. 1A) for a specified time. This valve configuration allows for both ALD and CVD deposition modes within a single delivery system configuration. A LabVIEW computer control program with I/O voltage interface electromechanically controls a series of miniature valves (Model: ET-3-24, Clippard Instrument Laboratory, Inc.) which, in turn, controls $N_2$ pressure to the pneumatic valves in the delivery lines. The control is consistent with FIGS. 5A-10B. Thus, via computer command, the open/close sequencing of delivery valves is controlled for ALD or CVD operation which allows alternating between the two modes of operation thereby providing a more efficient means of synthesizing thick-thin (i.e., micro-nano) laminated film structures within a single hybrid processing chamber. All valves are bolted firmly on a 12×12 in. aluminum plate for rigidity; and mounted right on top of the deposition chamber for compactness.

Oxidizer Delivery.

Water vapor is delivered as wet nitrogen created by passing $N_2$ over the head space of a water reservoir maintained at ice temperature. The dip tube within the water reservoir is deliberately cut to avoid nitrogen injection inside the water bath to reduce moisture content in the $N_2$ without requiring additional dilution or heating-up of downstream delivery lines to prevent water vapor condensation. An open-ended dip tube was cut 1 in. above water level. This arrangement markedly reduced oxidizer purging time from 20 s to 10 s. This oxidizer delivery line is connected with a proportional relief valve (Model: SS-RL3S4, Swagelok) and a pressure gauge to facilitate continuous stream of oxidizer at a set pressure (0.7 psi).

Ozone Generation.

UV lamp illumination is preferred over corona discharge because a UV lamp produces more uniform concentration over long period of time which is preferred for this study. Ozone affects O-rings used for sealing, but certain branded O-rings such as Viton®, Kalrez® & Teflon® are reported to be more resistant. In the example system, Viton® O-rings coated with a thin layer of Fomblin® high vacuum grease is used in this system. A 25 Watt UV germicidal lamp (Model: G24T5VH/U, Atlantic Ultraviolet Corporation) is used with suitable lamp holder and ballast. The lamp is housed within a 2.5 in. diameter aluminum cylinder with gas inlet and outlet ports. A four-pin, O-ring sealed power feed through is used to route the power cables of UV lamp through cylinder cap. The generator is placed immediately upstream of the deposition chamber to reduce ozone decomposition in delivery line. With pure oxygen (99.999% purity) at 0.7 psi as inlet gas, the experimental ozone generator produces about 1000 ppm of ozone, as measured with an ozone analyzer (Model 450, Advanced Pollution Inc.).

ALD Growth.

Figure 16:
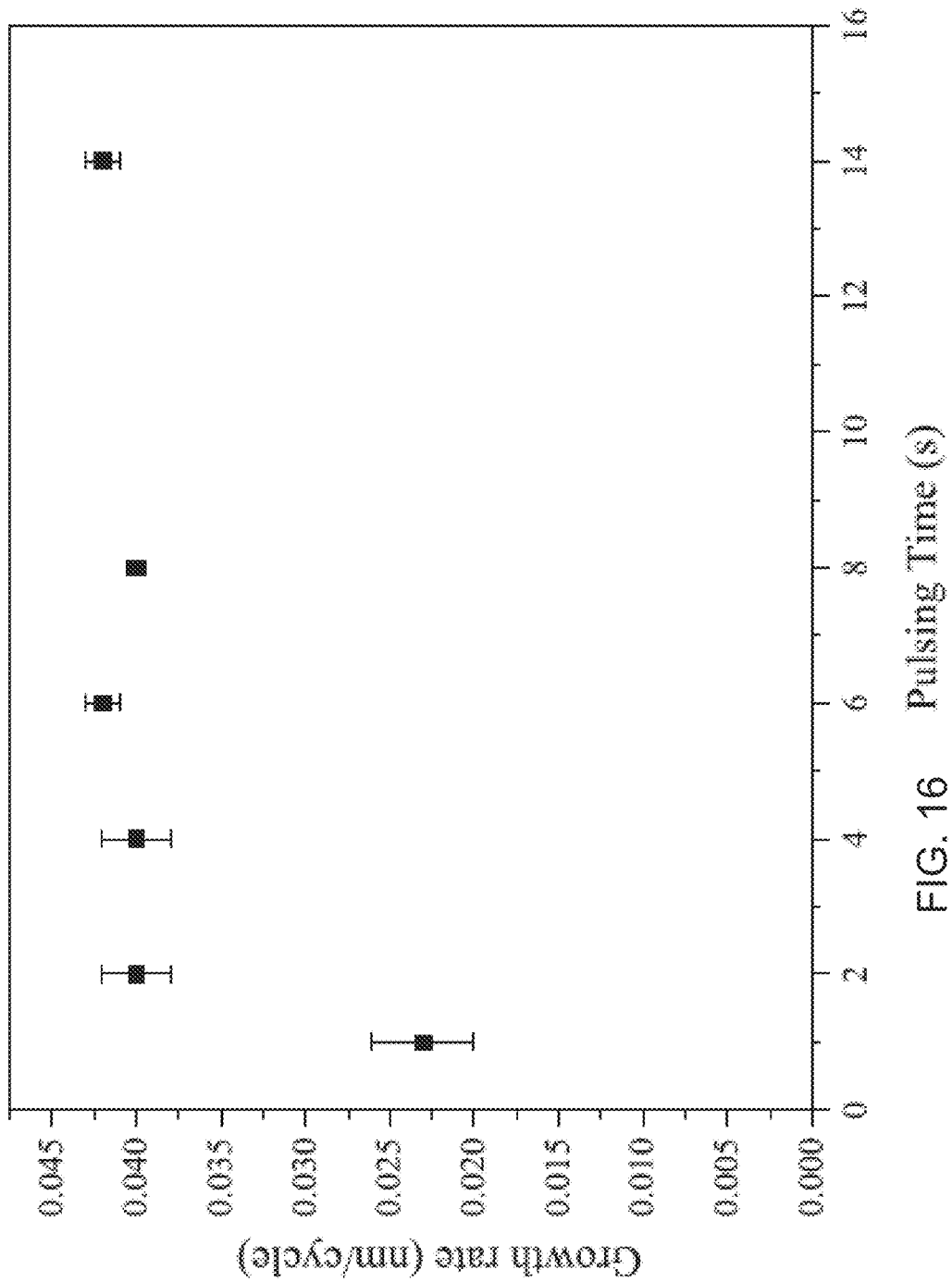
FIG. 16 represents data of ALD growth rate as a function of precursor pulse duration of $TiO_2$ using tetrakis(diethylamino)titanium (TDEAT) and water vapor.
Figure 17:
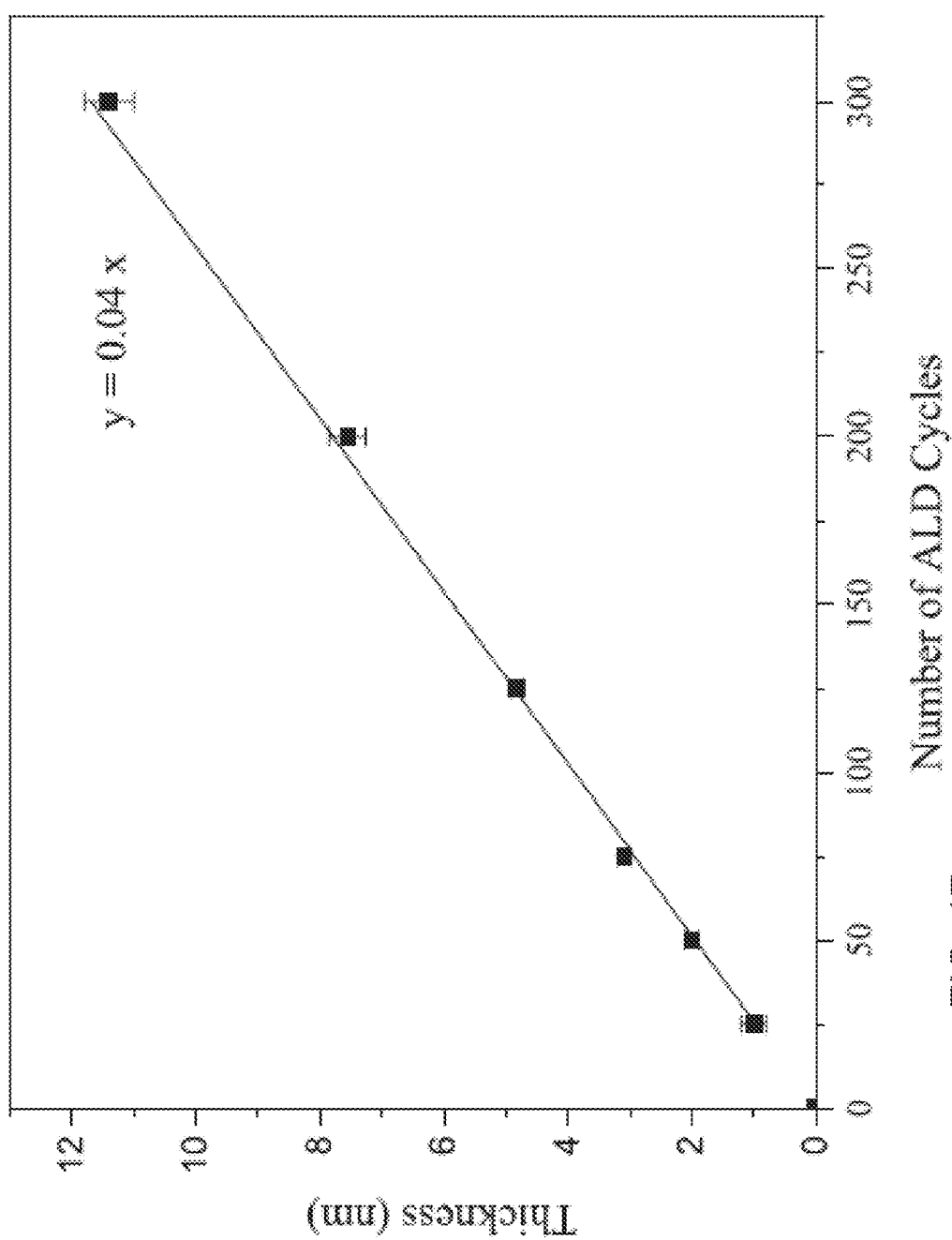
FIG. 17 represents data of ALD grown $TiO_2$ thickness as a function of ALD growth cycles.

The ALD mode of reactor operation was demonstrated with ALD of $TiO_2$ using tetrakis(diethylamino)titanium (TDEAT) and water vapor. Deposition was carried out on highly doped p-type Si(100) substrates (resistivity 1-10 $\Omega$-cm) cut into 2 cm×2 cm pieces. Radio Corporation of America standard cleaning (RCA SC-1) procedure was followed to clean the substrate prior to deposition. Deionized water (resistivity ≥17 M$\Omega$-cm) and nitrogen were used to clean the substrate after every RCA step. The substrates were loaded immediately after cleaning. FIG. 16 shows the effect of precursor pulse duration on growth rate of $TiO_2$ films deposited at 200° C. with 1 s oxidizer pulse. Precursor and oxidizer purging times were optimally fixed at 15 and 10 s, respectively, after ensuring no change in the growth rate with longer purge times. The TDEAT bubbler temperature was kept constant at 65° C. With increasing precursor pulse duration to 2 s, the film growth rate increases to 0.04 nm/cycle; no further increase in the growth rate was observed for longer precursor pulse durations beyond 2 s. This confirms the characteristic self-limiting growth behavior of ALD. Film growth rate was relatively insensitive to changes in oxidizer pulse time tested from 50 ms to 2 s. The $TiO_2$ film growth rate was independent of reactor temperature between 150 and 275° C., indicating adsorption controlled growth regime. FIG. 17 shows the film thickness measured after different number of ALD cycles. Good linearity demonstrates the thickness tunability with the experimental system of the invention. The composition of ALD $TiO_2$ films were probed with high resolution X-ray Photoelectron Spectroscopy (XPS) (Kratos AXIS-165, Kratos Analytical Ltd.) equipped with a monochromatic Al K$\alpha$ (1486.6 eV) X-ray source operating at 15 kV and 10 mA. Spectra were taken after sputtering the surface using ~100 nA $Ar^+$ beam for 20 min. Survey spectrum of 30 nm-thick film shows stoichiometric titanium oxide (Ti ~32 atom %; O ~66 atom %) with a trace amount of carbon (~2 atom %) and argon. Argon in the film most likely came from $Ar^+$ beam sputtering.

ALD/CVD Deposition.

The ALD/CVD hybrid mode was demonstrated using ALD of $TiO_2$ and CVD of $SnO_x$ at 250° C. A prolonged 5 min $N_2$ purging was performed when changing from ALD mode to CVD mode or vice versa to avoid memory effects. This purging time is an order of magnitude higher than the purging time used for ALD of $TiO_2$ and $SnO_x$ in the same system. The purge avoids/minimizes cross contamination between titanium and tin. The system has two purging lines, precursor purging line (bypass line) and oxidizer purging line (through 3-way switching valve) to ensure complete purging of remaining precursor and oxidizer out of deposition chamber. TEM imaging showed distinct layers of ALD and CVD. The thickness of layers are measured to be ~108 nm CVD-$SnO_x$: 10 nm ALD-$TiO_2$: 82 nm CVD-$SnO_x$: 11 nm ALD-$TiO_2$ which corresponds to 150 min of CVD-$SnO_x$: 150 cycles of ALD-$TiO_2$: 150 min of CVD-$SnO_x$: 150 cycles of ALD-$TiO_2$. The reduced thickness in the first CVD-$SnO_x$ layer may be due to a possible phase change from prolonged exposure (~4 hrs more than the second CVD-$SnO_x$ layer) to 250° C. during the deposition of the top layers.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A deposition system comprising:
    a reactor chamber;
    a plurality of reactant supply vessels;
    a carrier gas supply; and
    a supply line and valve set, the valve set including a plurality of actuated valves being arranged to selectively bypass the plurality of reactant supply vessels and deliver carrier gas to the reactor chamber or carry reactant from the plurality of reactant supply vessels to the reactor chamber by operating at least two valves of the plurality of actuated valves in tandem,
    the plurality of actuated valves being arranged such that each respective reactant supply vessel has an associated bypass valve connected between an upstream precursor supply valve disposed upstream of the respective reactant supply vessel and a downstream precursor supply valve disposed downstream of the respective reactant supply vessel, the upstream and downstream precursor supply valves controlling flow of carrier gas through the respective reactant supply vessel to establish a precursor supply path of carrier gas through the upstream precursor supply valve, the respective reactant supply vessel, the downstream precursor supply valve and to the reactor chamber and a bypass path of carrier gas through the associated bypass valve to the reactor chamber to bypass the respective reactant supply vessel;
    a secondary supply line connected via an actuated switching valve to reactant gas and inert gas supplies;
    a controller configured to control at least the upstream and downstream valves of the plurality of actuated valves in tandem and the associated bypass valve to selectively bypass one or both of reactant supplies and deliver reactant from one or both of the reactant supplies via an associated bypass path or precursor supply path;
    a first control software executable by the controller to control the plurality of actuated valves and the actuated switching valve in a first predetermined sequence to conduct CVD (chemical vapor deposition), wherein the first predetermined sequence comprises opening and closing the upstream and downstream precursor supply valves, opening and closing the associated bypass valve, and opening and closing the actuated switching valve; and a second control software executable by the controller to control the plurality of actuated valves and the actuated switching valve in a second predetermined sequence to conduct ALD (atomic layer deposition), wherein the second predetermined sequence comprises opening and closing the upstream and downstream precursor supply valves, opening and closing the associated bypass valve and opening and closing the actuated switching valve.

2. The system according to claim 1, wherein the valve set provides three operational flow states that consist of flow through bypass path, flow through the precursor supply path, and no flow.

3. The system according to claim 2, wherein the valve set further comprises auxiliary valves to isolate reactant during installation, removal or changing of a corresponding supply vessel.

4. The system according to claim 1, wherein the valve set further comprises auxiliary valves to isolate reactant during installation, removal or changing of a corresponding supply vessel.

5. The system according to claim 1, further comprising an interconnect supply line valve upstream of the reactant supplies that connects supply lines of two of the plurality of reactant supply vessels.

6. The system according to claim 1, wherein the valve set includes a common bypass valve that provides a bypass of two of the plurality of reactant supplies.

7. The system according to claim 1, wherein the valve set provides a separate bypass around each of the plurality of reactant supply vessels.

8. The system according to claim 1, further comprising:
a third control software executable by the controller to control the plurality of actuated valves and the actuated switching valve in a third sequence to sequentially conduct CVD and ALD deposition cycles, wherein the third predetermined sequence comprises opening and closing the upstream and downstream precursor supply valves, opening and closing the associated bypass valve, and opening and closing the actuated switching valve.

9. The system according to claim 1, wherein the first control software is executable by the controller to conduct the CVD cycle according to the first sequence by simultaneously flowing two reactants from a plurality of the reactant supplies to the reactor chamber.

10. The system according to claim 1, wherein the second control software is executable by the controller to conduct the ALD cycle according to the second sequence by sequentially flowing two reactants from a plurality of the reactant supplies to the reactor chamber with an intervening purge cycle between the sequentially flowing.

11. The system according to claim 1, wherein the plurality of reactant supply vessels comprises at least four reactant supply vessels.

12. A deposition system comprising:
a reactor;
a plurality of reactant supplies to said reactor, each reactant supply including a supply vessel and a reactant carrier gas path through said supply vessel to said reactor; each reactant supply being bypassed by a bypass path for flowing carrier gas in a bypass past the supply vessel;
a secondary supply line connected via an actuated switching valve to reactant gas and inert gas supplies;
a controller configured to control the carrier gas path and the bypass path to maintain a desired pressure in both the reactor and the supply vessel and to control flow of carrier and reactant into the reactor,
wherein, for each respective supply vessel, the bypass is performed by operating at least an upstream precursor supply valve and a downstream precursor supply valve connected to said respective supply vessel in tandem, the upstream precursor supply valve being disposed upstream of the respective supply vessel and the downstream precursor supply valve being disposed downstream of the respective supply vessel, wherein the reactant carrier gas path of the respective reactant supply vessel is defined through an associated bypass valve connected between the upstream and downstream precursor supply valves that control flow of carrier gas through the respective reactant supply vessel of the plurality of reactant supply vessels to establish the reactant carrier gas path of carrier gas through the upstream precursor supply valves, the respective reactant supply vessel, the downstream precursor supply valve and to the reactor, and the bypass path of carrier gas is defined through the associated bypass valve to the reactor chamber to bypass the respective reactant supply vessel; and further comprising:
a first control software executable by the controller to control at least the upstream and downstream valves, the associated bypass valve, and the actuated switching valve in first predetermined sequence to conduct CVD (chemical vapor deposition), wherein the first predetermined sequence comprises opening and closing the upstream and downstream precursor supply valves, opening and closing the associated bypass valve, and opening and closing the actuated switching valve; and
a second control software executable by the controller to control at least the upstream and downstream valves, the associated bypass valve, and the actuated switching valve in a predetermined sequence comprises opening and closing the upstream and downstream precursor supply valves, opening and closing the associated bypass valve, and opening and closing the actuated switching valve.

13. The system according to claim 12, further comprising:
a third control software executable by the controller to control the plurality of actuated valves and the actuated switching valve in a third sequence to sequentially conduct CVD and ALD deposition cycles.

14. The system according to claim 13, wherein the first control software is executable by the controller to conduct the CVD cycle according to the first sequence by simultaneously flowing two reactants from a plurality of the reactant supplies to the reactor.

15. The system according to claim 13, wherein the second control software is executable by the controller to conduct the ALD cycle according to the second sequence by sequentially flowing two reactants from a plurality of the reactant supplies to the reactor with an intervening purge cycle between the sequentially flowing.

16. The system of claim 13, wherein the reactant gas supply comprises an oxidizer supply.

* * * * *